US007236839B2

(12) United States Patent
Fujita et al.

(10) Patent No.: US 7,236,839 B2
(45) Date of Patent: Jun. 26, 2007

(54) AUDIO DECODER WITH EXPANDED BAND INFORMATION

(75) Inventors: Takeshi Fujita, Takatsuki (JP); Tomoko Sogabe, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 826 days.

(21) Appl. No.: 10/227,023

(22) Filed: Aug. 22, 2002

(65) Prior Publication Data

US 2003/0039364 A1 Feb. 27, 2003

(30) Foreign Application Priority Data

Aug. 23, 2001 (JP) ............................ 2001-253400

(51) Int. Cl.

| | |
|---|---|
| ***H04R 5/00*** | (2006.01) |
| ***H03G 3/00*** | (2006.01) |
| ***H03G 5/00*** | (2006.01) |
| ***G10L 19/00*** | (2006.01) |
| ***G10L 21/00*** | (2006.01) |
| ***G06F 17/00*** | (2006.01) |

(52) U.S. Cl. ............................ 700/94; 381/22; 381/23; 381/98; 381/61; 704/500; 704/501; 704/502

(58) Field of Classification Search ................ 704/500, 704/501, 502, 503, 504, 212; 381/94.3, 119, 381/61, 22, 23, 98; 330/10, 251, 207 A; 700/94

See application file for complete search history.

(56) References Cited

U.S. PATENT DOCUMENTS

| | | | | |
|---|---|---|---|---|
| 6,449,519 | B1 * | 9/2002 | Kuwaoka | 700/94 |
| 6,725,110 | B2 * | 4/2004 | Suzuki | 700/94 |

* cited by examiner

*Primary Examiner*—Vivian Chin
*Assistant Examiner*—Douglas Suthers
(74) *Attorney, Agent, or Firm*—Hamre, Schumann, Mueller & Larson, P.C.

(57) ABSTRACT

An audio processing unit that provides a high-sound-quality reproduction even when a band property of an input encoded signal drops at or below a Nyquist frequency. The audio processing unit has a band-variable bandpass filter 1500; a band determining section 1700 for determining a passband of the band-variable bandpass filter with respect to a band extension component from an extended band generating section 1300 by using decoding information from a decode-processing section 1100 as a band determination information; and a bandpass filter controller 1600 for controlling the passband of the band-variable bandpass filter in accordance with an indication from the band determining section.

26 Claims, 25 Drawing Sheets

MPEG Audio:

| Fs | Layer | Bit Rate Index | | | | | | | |
|---|---|---|---|---|---|---|---|---|---|
| | | 0 | 1 | ----- | 8 | 9 | 10 | ----- | 15 |
| 44.1k [Hz] | 1 | TBL0 | TBL0 | ----- | TBL5 | TBL6 | TBL6 | ----- | TBL0 |
| | 2 | TBL0 | TBL0 | | TBL5 | TBL5 | TBL6 | | TBL0 |
| | 3 | TBL0 | TBL0 | | TBL4 | TBL4 | TBL5 | | TBL0 |
| 48k [Hz] | 1 | TBL0 | TBL0 | | TBL4 | TBL5 | TBL5 | | TBL0 |
| | 2 | TBL0 | TBL0 | | TBL4 | TBL4 | TBL5 | | TBL0 |
| | 3 | TBL0 | TBL0 | | TBL3 | TBL3 | TBL4 | | TBL0 |
| 32k [Hz] | 1 | TBL0 | TBL0 | | TBL6 | TBL7 | TBL7 | | TBL0 |
| | 2 | TBL0 | TBL0 | | TBL6 | TBL6 | TBL7 | | TBL0 |
| | 3 | TBL0 | TBL0 | | TBL5 | TBL6 | TBL7 | | TBL0 |

AC3 :

| Fs | Spectral Information (Indexing) | | | | | | | |
|---|---|---|---|---|---|---|---|---|
| | 0 | 1 | ----- | 8 | 9 | 10 | ----- | 15 |
| 48k[Hz] | TBL3 | TBL3 | ----- | TBL6 | TBL6 | TBL6 | ----- | TBL8 |
| 44.1k[Hz] | TBL3 | TBL3 | | TBL6 | TBL6 | TBL6 | | TBL8 |
| 32k[Hz] | TBL3 | TBL4 | | TBL6 | TBL6 | TBL7 | | TBL9 |

FIG.23

| TBL No. | Filter Tap Coefficient | | | | |
|---|---|---|---|---|---|
| | Tap 1 | Tap 2 | Tap 3 | ----- | Tap n |
| TBL0 | Coeff [01], | Coeff [02], | Coeff [03], | ----- | ,Coeff [0n] |
| TBL1 | Coeff [11], | Coeff [12], | Coeff [13], | ----- | ,Coeff [1n] |
| TBL2 | Coeff [21], | Coeff [22], | Coeff [23], | ----- | ,Coeff [2n] |
| TBL3 | Coeff [31], | Coeff [32], | Coeff [33], | ----- | ,Coeff [3n] |
| TBL4 | Coeff [41], | Coeff [42], | Coeff [43], | ----- | ,Coeff [4n] |
| TBL5 | Coeff [51], | Coeff [52], | Coeff [53], | ----- | ,Coeff [5n] |
| TBL6 | Coeff [61], | Coeff [62], | Coeff [63], | ----- | ,Coeff [6n] |
| TBL7 | Coeff [71], | Coeff [72], | Coeff [73], | ----- | ,Coeff [7n] |
| TBL8 | Coeff [81], | Coeff [82], | Coeff [83], | ----- | ,Coeff [8n] |
| TBL9 | Coeff [91], | Coeff [92], | Coeff [93], | ----- | ,Coeff [9n] |

FIG.24

AUDIO DECODER WITH EXPANDED BAND INFORMATION

BACKGROUND OF THE INVENTION

1. Field of the Invention

The present invention relates to a digital signal processing technique. Specifically, the present invention relates to an audio processing unit for realizing high sound quality reproduction by decoding an audio compress-encoded signal and conducting a band extension process.

2. Description of the Related Art

Various methods have been proposed for realizing high-sound-quality reproduction by conducting a band extension process. In one method, a band is extended to realize a reproduction with high sound quality by conducting a N times oversampling (N is an integer bigger than 1) a decoded PCM signal having a sampling frequency Fs, and adding to the oversampled PCM signal having a sampling frequency of N×Fs/2 a noise signal having a band component of a band from Fs/2 to N×Fs/2. This method is performed, for example, using an audio processing unit having a structure as shown in FIG. 25.

This audio processing unit 10000 is composed of a decode-processing section 1100, an oversampling section 1200, an extended band generating section 1300 and a bandpass filter 1400.

The decode-processing section 1100 has a function of decoding an encoded audio stream inputted from outside and generating PCM data. The oversampling section 1200 receives the PCM data decoded by the decode-processing section 1100 so as to perform a N times oversampling, and outputs PCM data that is oversampled N times. The extended band generating section 1300 has a function of generating a band extension component with respect to the PCM data oversampled by the oversampling section 1200. The bandpass filter 1400 is a filter for passing components that are in a band from around Fs/2 to N×Fs/2 among band extension components generated by the extended band generating section 1300.

For facilitating the explanation, the decode-processing section 1100 is regarded here as a decoder corresponding to a DVD-Video standard, and this description refers to a case where an audio bit stream according to a DVD-Video standard linear PCM is inputted. Here, the inputted audio bit stream has a sampling frequency of 48 kHz. The oversampling section 1200 generates PCM data having a sampling frequency of 96 kHz by inserting one sample of '0' data to each spacing between the PCM data having a sampling frequency of 48 kHz outputted from the decode-processing section 1100, conducting the oversampling, and rejecting a noise by use of an antialiasing filter. The extended band generating section 1300 has a function of generating a harmonic bandpass extension component of at most approximately 48 kHz on the basis of the PCM data of 96 kHz oversampled by the oversampling section 1200. The bandpass filter 1400 passes components that are in a band from about 24 kHz to about 48 kHz among band extension components generated by the extended band generating section 1300.

As shown in FIG. 25, when an audio bit stream according to a linear PCM of a DVD-Video standard is inputted to the decode-processing section 1100, the decode-processing section 1100 generates PCM data having a sampling frequency, a channel mode, a quantization bit length based on an encoding mode represented at a private head, and outputs the data. The PCM data generated here is a signal that can have a band property of at most 24 kHz due to a Nyquist condition, since the data has a sampling frequency of 48 kHz, and the input bit stream data is an uncompressed and reversible encoded signal.

Next, the oversampling section 1200 inserts one sample of '0' data between the respective PCM data generated at the decode-processing section 1100, and transforms it into PCM data having a sampling frequency of 96 kHz by using an antialiasing filter. At this time, the band property of the PCM data is at most 24 kHz just as the input PCM data, since an antialiasing noise is reduced by using the antialiasing filter.

The extended band generating section 1300 generates a band extension component formed of a harmonic of at most about 48 kHz based on PCM data having sampling frequency of 96 kHz processed at the oversampling section 1200, and outputs the component. The thus generated band extension component has an oversampling frequency of 96 kHz, the same as the PCM data processed at the oversampling section 1200. The band extension component generated at the extended band generating section 1300 is limited to a band from about 24 kHz to a band lower than about 48 kHz by a bandpass filter 1400, and the output data is added to PCM data processed at the oversampling section 1200, and outputted to the outside.

In such a case of an audio processing unit, when inputted encoded data is an uncompressed and reversible encoded audio signal such as an audio stream according to a DVD-Video standard linear PCM, it can be designed as a band extension component under a Nyquist condition, and thus, a targeted band extension region can be set fixedly as described above. Accordingly, an excellent band extension effect can be expected.

However, in a case of an audio processing unit targeting a DVD standard audio encoded signal, which has been spread recently in the market, an encoded signal to be decoded is not limited to linear PCM, but encoded signals with information compression should be considered as well, such as Dolby digital encoding system (AC3) and a MPEG audio standard. These encoding systems depend on irreversibly-encoded signals subjected to information compression on the basis of human audibility, a masking effect or the like. In many cases, linear PCM with a sound source having a sampling frequency of 48 kHz before encoding is compressed to 10-20% after an encoding. Even when a band component is contained in a band of about 24 kHz under a Nyquist condition (Fs/2) in a sound source before encoding, the component will be dropped at the time of encoding.

In many cases of inputting such an encoded signal, PCM data decoded by the decode-processing section 1100 contains substantially no band components around the Nyquist condition in the above-mentioned audio processing unit. Therefore, even by conducting a band extension process as mentioned above, a linear band extension will not be performed on a frequency axis. Since this leads to a dropout of a band component in a range from an upper limit of the band of PCM data decoded by the decode-processing section 1100 to around the Nyquist frequency (Fs/2), a sufficient band extension effect cannot be obtained.

SUMMARY OF THE INVENTION

For solving the above-described problems of conventional techniques, an object of the present invention is to provide an audio processing unit that can realize a high sound quality reproduction by extending a band corresponding to a nature of PCM data to be decoded, even when a band property of an input encoded signal drops at or below a Nyquist frequency (Fs/2).

For achieving the above-mentioned object, a first audio processing unit according to the present invention is an audio processing unit for decoding and reproducing an encoded audio signal, and the audio processing unit comprises a decode-processing section for decoding the encoded audio signal that is inputted from the outside and generating PCM data; an extended band generating section for generating a band extension component with respect to the PCM data decoded by the decode-processing section; a band-variable bandpass filter for receiving the band extension component from the extended band generating section, varying a passband and outputting; an adder for adding the PCM data decoded by the decode-processing section and output data from the band-variable bandpass filter; and a bandpass filter controller for controlling the passband of the band-variable bandpass filter.

For achieving the above-mentioned object, a second audio processing unit according to the present invention is an audio processing unit for decoding and reproducing an encoded audio signal, and the audio processing unit comprises a decode-processing section for decoding the encoded audio signal that is inputted from the outside and generating PCM data; an oversampling section for conducting an oversampling process with respect to the PCM data decoded by the decode-processing section; an extended band generating section for generating a band extension component with respect to the PCM data oversampled by the oversampling section; a band-variable bandpass filter for receiving a band extension component from the extended band generating section, varying the passband and outputting; an adder for adding output data from the oversampling section and output data from the band-variable bandpass filter; and a bandpass filter controller for controlling the passband of the band-variable bandpass filter.

According to the above-described configuration, since the extended band can be controlled by providing a band-variable bandpass filter and a bandpass filter controller, excellent high sound quality reproduction can be realized.

Unlike the second audio processing unit, the first audio processing unit does not has an oversampling section. Still the first audio processing unit can provide a similar effect except that the upper limit of the frequency of the extended band is limited due to the Nyquist condition.

In addition to that, when an oversampling section is not included, processes and structures for the oversampling section can be omitted. Moreover, the processing amount can be decreased as the sampling frequency of the PCM data to be processed subsequent to the decode-processing section is lower than the case including the oversampling section, and thus it is more effective in a case of equipping a small-scale system requiring reduced power consumption.

For achieving the above-described object, a third audio processing unit of the present invention is an audio processing unit for decoding and reproducing an encoded audio signal, and the audio processing unit comprises a decode-processing section for decoding the encoded audio signal that is inputted from the outside and generating PCM data; an extended band generating section for generating a band extension component with respect to the PCM data decoded by the decode-processing section; a band-variable bandpass filter for receiving the band extension component from the extended band generating section, varying a passband and outputting; an adder for adding the PCM data decoded by the decode-processing section and output data from the band-variable bandpass filter; a band determining section for determining the passband with respect to the band extension component, by using a decoding information obtained from the decode-processing section as band determination information; and a bandpass filter controller for controlling the passband of the band-variable bandpass filter in accordance with an indication from the band determining section.

For achieving the above-described object, a fourth audio processing unit according to the present invention is an audio processing unit for decoding and reproducing an encoded audio signal, the audio processing unit comprises a decode-processing section for decoding the encoded audio signal that is inputted from the outside and generating PCM data; an oversampling section for conducting an oversampling process with respect to the PCM data decoded by the decode-processing section; an extended band generating section for generating a band extension component with respect to the PCM data oversampled by the oversampling section; a band-variable bandpass filter for receiving a band extension component from the extended band generating section, varying the passband and outputting; an adder for adding output data from the oversampling section and output data from the band-variable bandpass filter; a band determining section for determining the passband with respect to the band extension component, by using a decoding information obtained from the decode-processing section as band determination information; and a bandpass filter controller for controlling the passband of the band-variable bandpass filter in accordance with an indication from the band determining section.

For achieving the above-described object, a fifth audio processing unit according to the present invention is either the third or fourth audio processing unit, wherein the band determining section comprises a spectrum analyzer for analyzing a spectrum of the PCM data generated by the decode-processing section and determines a passband with respect to the band extension component by using the analytical result from the spectrum analyzer as the band determination information.

According to the above-described configuration, a band-variable bandpass filter, a band determining section and a bandpass filter controller are provided, and the band determining section comprises a spectrum analyzer. Thereby, the extended band can be controlled automatically without the need for an external control, and thus excellent reproduction with high sound quality can be realized.

For achieving the above-described object, a sixth audio processing unit according to the present invention is either the third or fourth audio processing unit, wherein the decode-processing section comprises: an auxiliary information analyzing section for analyzing auxiliary information of the encoded audio signal, a spectrum data generating section for generating spectrum data on the basis of the auxiliary information, a PCM data generating section for transforming the spectrum data and generating PCM data, and a spectrum information sending section for externally sending spectrum information of the spectrum data generated at the spectrum data generating section; the band determining section comprises a spectrum information receiving section for receiving the spectrum information sent from the spectrum information sending section and determines a passband with respect to the band extension component by using the spectrum information as the band determination information.

According to the above-described configuration, a spectrum information sending section is provided in the decode-processing section and a spectrum information receiving section is provided in the band determining section.

Thereby, the extended band can be controlled automatically without the need for an external control, and thus excellent reproduction with high sound quality can be provided. Furthermore, since the band determination process is performed using spectrum information generated by decoding at the decode-processing section, there is no need for providing a spectrum analyzer at the band determining section, and thus the throughput required for band determination can be decreased.

For achieving the above-described object, a seventh audio processing unit according to the present invention is either the third or fourth audio processing unit, wherein the decode-processing section comprises: an auxiliary information analyzing section for analyzing auxiliary information of the encoded audio signal, a subband data generating section for generating subband data on the basis of the auxiliary information, a PCM data generating section for band-composing the subband data and generating PCM data, and a subband amplitude information sending section for externally sending amplitude information of subband data generated by the subband data generating section; the band determining section comprises a subband amplitude information receiving section for receiving the subband amplitude information sent from the subband amplitude information sending section and determines a passband with respect to the band extension component by using the subband amplitude information as the band determination information.

According to the above-described configuration, a subband amplitude information sending section is provided in the decode-processing section and a subband amplitude information receiving section is provided in the band determining section. Thereby, the extended band can be controlled automatically without the need for an external control, and thus excellent reproduction with high sound quality can be realized. Furthermore, since the band determination process is performed using subband amplitude information generated by decoding at the decode-processing section, there is no need to provide a spectrum analyzer at the band determining section, and thus throughput required for band determination can be decreased.

For achieving the above-described object, an eighth audio processing unit according to the present invention is either the third or fourth audio processing unit, wherein the decode-processing section comprises: an auxiliary information analyzing section for analyzing auxiliary information of the encoded audio signal, a decode-core section for conducting a decoding process and generating PCM data, and a scale factor information sending section for externally sending scale factor information extracted by the auxiliary information analyzing section; and the band determining section comprises a scale factor information receiving section for receiving the scale factor information sent from the scale factor information sending section and determines a passband with respect to the band extension component by using the scale factor information as the band determination information.

According to the above-described configuration, a scale factor information sending section is provided in the decode-processing section and a scale factor information receiving section is provided in the band determining section. Thereby, the extended band can be controlled automatically without the need for an external control, and thus excellent reproduction with high sound quality can be provided. Furthermore, since the band determination is performed using scale factor information generated by decoding at the decode-processing section, there is no need to provide a spectrum analyzer at the band determining section, and thus throughput required for band determination can be decreased.

For achieving the above-described object, a ninth audio processing unit according to the present invention is either the third or fourth audio processing unit, wherein the decode-processing section comprises: an auxiliary information analyzing section for analyzing auxiliary information of the encoded audio signal, a decode-core section for conducting a decoding process and generating PCM data on the basis of the auxiliary information, and a bit rate information sending section for externally sending bit rate information extracted by the auxiliary information analyzing section; the band determining section comprises a bit rate information receiving section for receiving the bit rate information sent from the bit rate information sending section and determines a passband with respect to the band extension component by using the bit rate information as the band determination information.

According to the above-described configuration, a bit rate information sending section is provided in the decode-processing section and a bit rate information receiving section is provided in the band determining section. Thereby, the extended band can be controlled automatically without the need for an external control. Furthermore, since the band determination process is performed using bit rate information generated by decoding at the decode-processing section, there is no need of providing a spectrum analyzer at the band determining section, and thus throughput required for band determination can be decreased. Furthermore, by corresponding the bit rate information to a specific frequency property, a band extension region is set fixedly when encoding is conducted with a fixed bit rate, and thus, a band extension process can be performed with a comparative stability.

For achieving the above-described object, a tenth audio processing unit according to the present invention is the ninth audio processing unit, wherein the decode-processing section comprises a sampling frequency information sending section for externally sending sampling frequency information extracted by the internal auxiliary information analyzing section; and the band determining section comprises a sampling frequency information receiving section for receiving the sampling frequency information sent from the sampling frequency information sending section and a band determination information generating section for generating the band determination information from a combination of the sampling frequency information and the bit rate information, and determines a passband with respect to the band extension component by using the band determination information generated by the band determination information generating section.

According to the above-described configuration, a sampling frequency information sending section is provided in the decode-processing section and a sampling frequency information receiving section is provided in the band determining section, and further a band determination information generating section is provided in the band determining section in order to generate band determination information from a combination of sampling frequency information and bit rate information. Thereby, the extended band can be controlled corresponding to the sampling frequency and bit rate without the need for an external control. Furthermore, since the audio processing unit configured as described above conducts a band determination process by combining sampling frequency information and bit rate information, a more precise band determination can be realized in a comparison with the ninth audio processing unit due to the additional sampling frequency information.

For achieving the above-described object, an eleventh audio processing unit according to the present invention is the tenth audio processing unit, wherein the decode-processing section comprises a layer information sending section for externally sending layer information extracted by the internal auxiliary information analyzing section; the band determining section comprises a layer information receiving section for receiving the layer information sent from the layer information sending section and a band determination information generating section for generating the band determination information from a combination of the layer information, the sampling frequency information and the bit rate information, and determines a passband with respect to the band extension component by using the band determination information generated by the band determination information generating section.

According to the above-described configuration, a layer information sending section is provided in the decode-processing section and a layer information receiving section is provided in the band determining section, and further a band determination information generating section is provided for generating band determination information from a combination of layer information, sampling frequency information, and bit rate information. Thereby, the extended band can be controlled automatically corresponding to a layer, a sampling frequency and bit rate information, without the need for an external control. Furthermore, since the audio processing unit configured as described above conducts a band determination process by combining layer information, sampling frequency information and bit rate, a more precise band determination can be realized in a comparison with the tenth audio processing unit due to the additional layer information.

For achieving the above-described object, a twelfth audio processing unit according to the present invention is any of the third to the eleventh audio processing units, wherein the band determining section comprises a band determination smoothing section for automatically smoothing a change of the band determination information sent from the decode-processing section and determines a passband with respect to the band extension component by using band determination information smoothed by the band determination smoothing section.

According to the above-described configuration, a band determination smoothing section is provided. Therefore, a change in sound quality of the band extension component caused by a fluctuation in the band determination can be smoothened even when the frequency property of the reproduced PCM data changes rapidly, and thus a comparatively stable band extension process can be realized.

For achieving the above-described object, a thirteenth audio processing unit according to the present invention is any of the third to the eleventh audio processing units, wherein the audio processing unit comprises a band determination interval setting section for setting, in accordance with an external signal, a time interval for a band determination process at the band determining section.

According to the above-described configuration, a band determination interval setting section is provided. Thereby, responsivity of the band extension process can be adjusted corresponding to the characteristics of the reproduced PCM data, the user's preference, or the like.

For achieving the above-described object, a fourteenth audio processing unit according to the present invention is any of the third to the eleventh audio processing units, wherein the audio processing unit comprises a band determination threshold setting section for setting in accordance with an external signal a level threshold for discriminating a subband amplitude or presence of spectrum information in the band determination process at the band determining section with respect to each band.

According to the above-described configuration, a band determination threshold setting section is provided. Thereby, the extended band of the band extension process can be adjusted corresponding to the reproduced PCM data, the user's preference, or the like.

For achieving the above-described object, a fifteenth audio processing unit according to the present invention is any of the third to the fourteenth audio processing units, wherein the decode-processing section corresponds to a decoding process for at least two kinds of decoding systems, and switches the decoding process on the basis of decoder information designated by the outside; the band determining section comprises a band determination switching means for each decoder, which switches the band determination process in accordance with decoder information designated by the outside.

For achieving the above-described object, a sixteenth audio processing unit according to the present invention is the fifteenth audio processing unit, wherein the audio processing unit comprises a filter coefficient table storing a filter coefficient for use in the band-variable bandpass filter; and the band determination switching means for each decoder is a band determination information designating table for each decoder, which is used for designating each band to each decoder; and the band determining section conducts a band determination on the basis of the band determination information designating table for each decoder in accordance with decoder information that is designated by the outside and sends band determination information as pointer information of the filter coefficient table to the bandpass filter controller.

According to any of the configurations of the fifteenth and sixteenth audio processing units, wherein a band determination information designating table for each decoder is provided as a band determination switching means for each decoder. Thereby, a band determination process can be conducted corresponding to varied plural decoding processes respectively, and thus further optimum band extension process can be realized automatically.

Furthermore, according to the sixteenth audio processing unit where the band determination information designating table for each decoder and the filter coefficient table are separated and the band determination information is used as the pointer information of the filter coefficient table, the filter tap coefficient can be shared even in a case of a band determination process corresponding to decoding processes varied in the band determination. Accordingly, the memory resource required for the filter tap coefficient can be decreased since the filter tap coefficient can be shared.

BRIEF DESCRIPTION OF THE DRAWINGS

FIG. 23 is a diagram showing a structural example of table data of a band determination information designating table for each decoder, which is contained in the band determining section according to the thirteenth embodiment of the present invention.

FIG. 24 is a diagram showing a structural example of table data of a filter coefficient table according to the thirteenth embodiment of the present invention.

DETAILED DESCRIPTION OF THE INVENTION

Preferred embodiments according to the present invention will be described below with reference to the attached drawings.

First Embodiment

Figure 1:
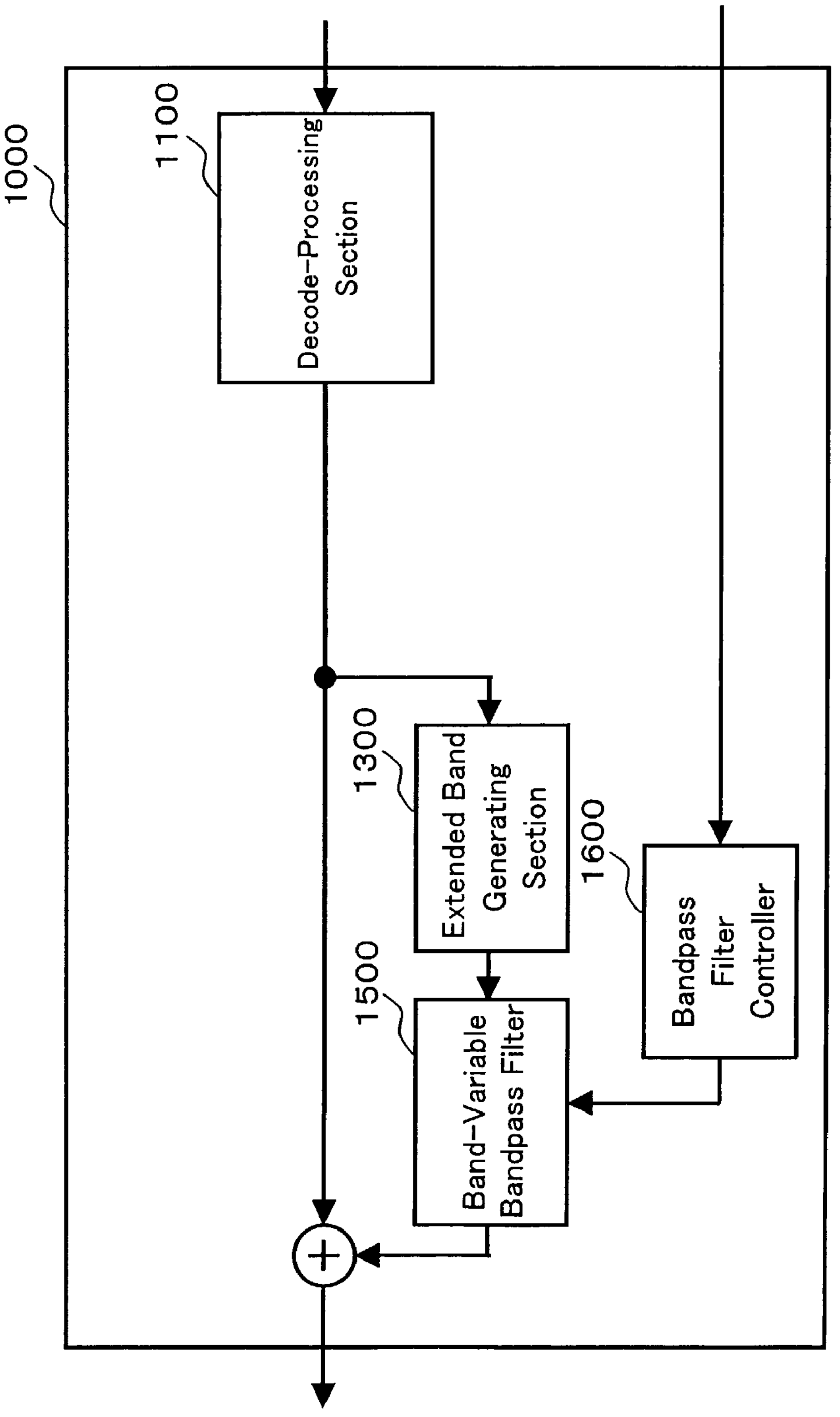
FIG. 1 is a circuit block diagram showing a structural example of an audio processing unit according to a first embodiment of the present invention.

FIG. 1 is a circuit block diagram showing a structural example of an audio processing unit 1000 according to a first embodiment of the present invention. This embodiment refers to a case of inputting an audio signal encoded in a MPEG audio standardization system and decoding the encoded signal into an audio signal. The MPEG audio standard is explained in detail in ISO/IEC 11172-3:1993 and 13818-3:1996. Here, every audio bit stream to be inputted has a sampling frequency of 48 kHz.

In FIG. 1, the audio processing unit 1000 includes a decode-processing section 1100, an extended band generating section 1300, a band-variable bandpass filter 1500, and a bandpass filter controller 1600.

The decode-processing section 1100 is a module for decoding an audio stream inputted from outside and generating PCM data, and it has at least a function of decoding an audio signal encoded in the MPEG audio standardization system.

The extended band generating section 1300 has a function of generating a band extension component with respect to PCM data decoded by the decode-processing section 1100. The extended band generating section 1300 in this embodiment generates and outputs a band extension component containing a harmonic of at most about 24 kHz on the basis of PCM data having a sampling frequency of 48 kHz. Here, the thus generated band extension component has a sampling frequency of 48 kHz that is as the same the PCM data decoded by the decode-processing section 1100.

The band-variable bandpass filter 1500 is a filter that can variably set the lower limit frequency of the passband by an external control with respect to the band extension component generated by the extended band generating section 1300. In this embodiment, the lower limit frequency FcL of the passband can be set within a range of FL1 to FL2 (FL1<FL2, FL2<Fs/2), and the upper limit of the passband is fixed at FcH (FL2 <FcH<Fs/2).

The bandpass filter controller 1600 is a controller for controlling the passband of the band-variable bandpass filter 1500 in accordance with an external indication. For facilitating the explanation, the bandpass filter controller 1600 in this embodiment is set to control the lower limit frequency FcL of the passband of the band-variable bandpass filter 1500, and specifically, it is set to enable controlling of the variable range of the FcL between FL1 and FL2.

Next, a reproduction process in the thus configured audio processing unit 1000 is explained below for a case of inputting an audio signal encoded in a MPEG audio standardization system and decoding the encoded signal into an audio signal.

Since in general an audio bit stream including an audio signal encoded in a MPEG audio standardization system requires compression-encoding to correspond to a setting such as a bit rate that is set at a time of encoding, it is subjected to an information compression corresponding to human auditory performance, masking effects or the like. As a result, for a case of linear PCM whose sound source before encoding has a sampling frequency of 48 kHz, even when a band component of about 24 kHz satisfying a Nyquist condition (Fs/2) is contained in the sound source before encoding, the component will drop at the time of the encoding. In this embodiment, for facilitating the explanation, the band property is regarded to have a band property deteriorating to 16 kHz or lower because of a compression process at the time of encoding.

In this case, the PCM data decoded by the decode-processing section 1100 according to this embodiment has a band property of 16 kHz or lower under the above-described encoding condition.

Similarly, the extended band generating section 1300 generates and outputs a band extension component containing a harmonic of at most about 24 kHz on the basis of PCM data having a sampling frequency of 48 kHz that is processed by the decode-processing section 1100. The band extension component generated here has a sampling frequency of 48 kHz that is the same as the PCM data processed at the decode-processing section 1100.

The bandpass filter controller 1600 has a function of variably controlling the lower limit frequency FcL of the passband in accordance with an external indication. In this case, an effective band extension reproduction can be provided by setting the lower limit frequency FcL of the passband at about 16 kHz from the outside. At the band-variable bandpass filter 1500 at this time the passband is in a range of FL2to FcH, and thus the band is extended with a linear and further natural band property with respect to the band of the sound source of at most about 16 kHz, as a result of addition of the pass component and the PCM data outputted from the decode-processing section 1100.

Provided that the lower limit frequency FcL of the bandpass filtering process with respect to the output of the extended band generating section 1300 has a fixed value just as a conventional technique, e.g., in a case it is set at about 18 kHz, the output signal provided by the addition of the output from the bandpass filter and the output of the oversampling section has a band property with a dropout of a band in a range from 16 kHz to 18 kHz. This cannot be regarded as an excellent reproduction of a high quality-sound. In a case the lower limit frequency FcL is set at about 12 kHz, the band property of the output signal provided by addition of the output from the bandpass filter and the output of the oversampling section would be overlapped in a band of 12 kHz to 16 kHz. This would lead to an extra load of a band signal, and thus, cannot be regarded as an excellent reproduction of a high quality-sound.

However, since the extended band can be controlled in this embodiment by introducing as elements a band-variable bandpass filter 1500 and a bandpass filter controller 1600, further improved reproduction with high sound quality can be provided.

Second Embodiment

Figure 2:
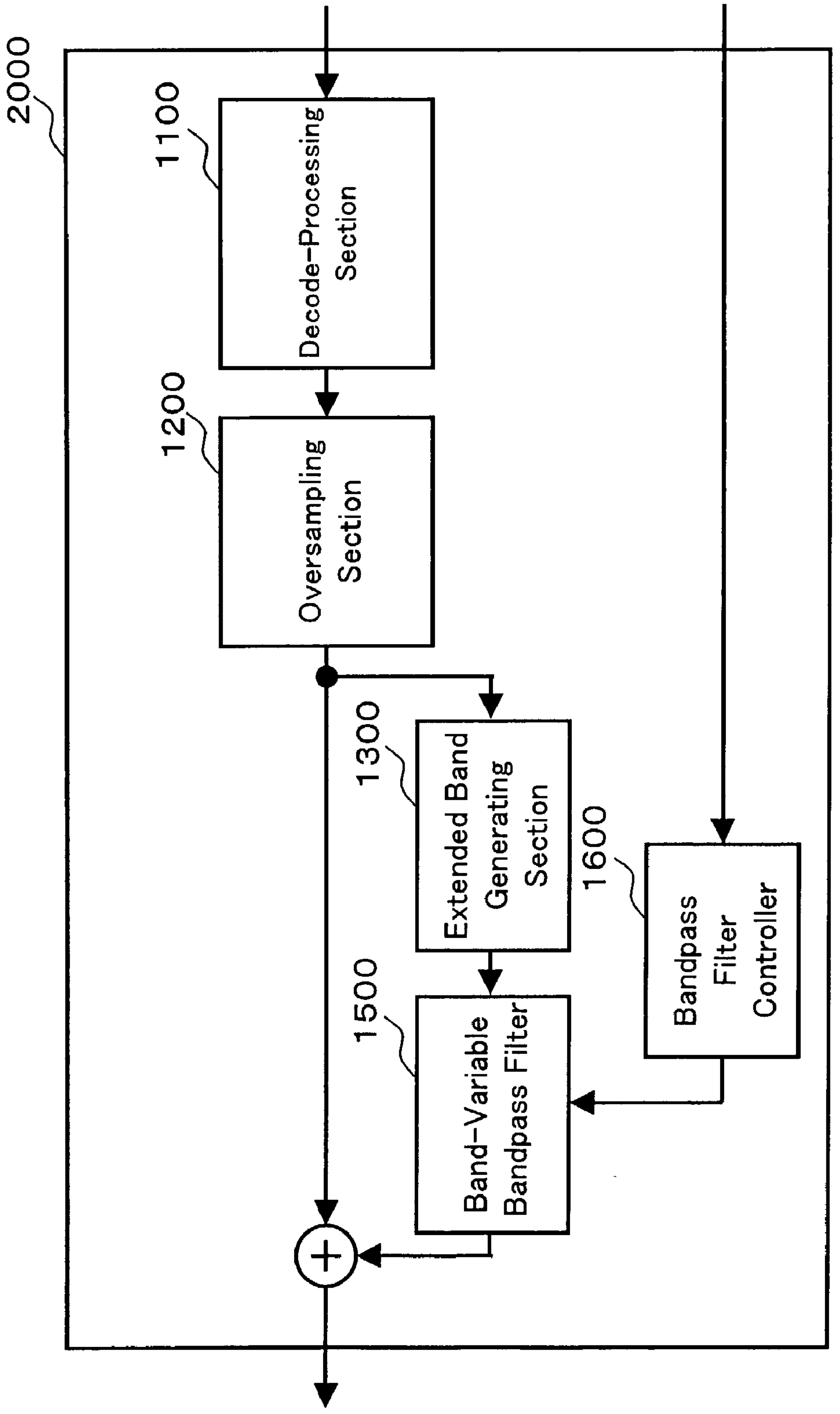
FIG. 2 is a circuit block diagram showing a structural example of an audio processing unit according to a second embodiment of the present invention.

FIG. 2 is a circuit block diagram showing a structural example of an audio processing unit according to a second embodiment of the present invention. In FIG. 2, an audio processing unit 2000 includes a decode-processing section 1100, an oversampling section 1200, an extended band generating section 1300, a band-variable bandpass filter 1500 and a bandpass filter controller 1600.

Since the decode-processing section 1100, the extended band generating section 1300, the band-variable bandpass filter 1500 and the bandpass filter controller 1600 respectively have substantially the same functions as in the first embodiment, detailed descriptions thereof will be omitted.

The oversampling section 1200 receives the PCM data decoded at the decode-processing section 1100 so as to conduct a N times oversampling process, and outputs the PCM data that is oversampled N times. Here, the oversampling process at the oversampling section 1200 in this embodiment denotes a generation of PCM data having a sampling frequency of 96 kHz by inserting each sample of '0' data into spacing between the respective PCM data having a sampling frequency of 48 kHz outputted from the decode-processing section 1100, conducting the oversampling, and reducing a noise by using an antialiasing filter.

The extended band generating section 1300 has a function of generating a band extension component with respect to the PCM data oversampled by the oversampling section 1200. The extended band generating section 1300 according to this embodiment generates and outputs a band extension component containing a harmonic of at most about 48 kHz on the basis of PCM data having a sampling frequency of 96 kHz processed at the oversampling section 1200. The sampling frequency of the band extension component generated here is 96 kHz, the same as that of the PCM data processed at the oversampling section 1200.

The following description is about a case where an audio bit stream having a sampling frequency of 48 kHz to correspond to a DVD-Video standard linear PCM system is inputted in a reproduction process in the thus configured audio processing unit 2000.

In general, when an audio bit stream according to a DVD-Video standard linear PCM system has the identical sampling frequency to that of the sound source before encoding, the stream has the same band property as the sound source and the expected frequency is about 24 kHz at most, since the sound source is subjected to an uncompress-encoding.

Considering these conditions, PCM data decoded by the decode-processing section 1100 according to this embodiment can duplicate the band property of the sound source with high-fidelity. When the frequency band of the sound source exists in a range of at most about 24 kHz satisfying a Nyquist condition, the frequency property of the decoded PCM data will exist in a range of at most about 24 kHz as well.

In this case, since the oversampling section 1200 conducts oversampling on the PCM data outputted from the decode-processing section 1100, the oversampled PCM data has a sampling frequency of 96 kHz, and the band property is substantially the same as that of the inputted PCM data. A band of about 24 kHz at most is retained.

The extended band generating section 1300 generates and outputs a band extension component containing a harmonic of at most about 48 kHz on the basis of the PCM data having a sampling frequency of 96 kHz processed at the oversampling section 1200. The sampling frequency of the band extension component generated here is 96 kHz, the same as that of the PCM data processed at the oversampling section 1200.

For the bandpass filter controller 1600, an effective band extension reproduction can be obtained by designating the lower limit frequency FcL of the passband to be FL2(here, about 24 kHz) as the maximum frequency of the variable band from the outside. In this case, since the passband is in a range of FL2 to FcL at the band-variable bandpass filter 1500, band extension will be conducted with a linear and more natural band property with respect to a band of a sound source of at most about 24 kHz as a result of addition of the pass component and the PCM data outputted from the oversampling section 1200. Thereby, a reproduction with high sound quality can be obtained.

The following description is about a case of inputting an audio signal encoded in a MPEG audio standardization system and decoding the encoded signal into an audio signal.

Since in general an audio bit stream including an audio signal encoded in a MPEG audio standardization system requires compression-encoding to correspond to a setting such as a bit rate that is set at a time of encoding, it is subjected to an information compression corresponding to human auditory performance, masking effects or the like. As a result, for a case of linear PCM whose sound source before encoding has a sampling frequency of 48 kHz, even when a band component of about 24 kHz satisfying a Nyquist condition (Fs/2) is contained in the sound source before encoding, the component will drop at the time of the encoding. In this embodiment, for facilitating the explanation, the band property is regarded to have a band property deteriorating to 16 kHz or lower because of a compression process at the time of encoding.

In this case, the PCM data decoded by the decode-processing section 1100 according to this embodiment has a band property of 16 kHz or lower under the above-described encoding condition.

Similarly, since the oversampling section 1200 conducts oversampling on the PCM data outputted from the decode-processing section 1100, the oversampled PCM data has a sampling frequency of 96 kHz, and the band property is substantially the same as that of the inputted PCM data. Therefore, the PCM data after the oversampling process remains 16 kHz or lower.

The extended band generating section 1300 generates a band extension component containing a harmonic of at most about 48 kHz on the basis of the PCM data having a sampling frequency of 96 kHz processed at the oversampling section 1200, and outputs. The sampling frequency of the band extension component generated here is 96 kHz, the same as that of the PCM data processed at the oversampling section 1200.

The bandpass filter controller 1600 has a function of variably controlling the lower limit frequency FcL of the passband in accordance with an external indication. In this case, an effective band extension reproduction can be provided by setting the lower limit frequency FcL of the passband at about 16 kHz from the outside. At the band-variable bandpass filter 1500 at this time the passband is in a range of FL2 to FcH, and thus the band is extended with a linear and further natural band property with respect to the band of the sound source of at most about 16 kHz as a result of addition of the pass component and the PCM data outputted from the oversampling section 1200.

Provided that the lower limit frequency FcL of the bandpass filtering process with respect to the output of the extended band generating section 1300 has a fixed value just as a conventional technique, e.g., it may be set at about 24 kHz in accordance with a Nyquist condition, the output signal provided by the addition of the output from the bandpass filter and the output of the oversampling section has a band property with a dropout of a band in a range from 16 kHz to 24 kHz. This cannot be regarded as an excellent reproduction of a high quality-sound. However, since the extended band can be controlled in this embodiment by introducing as elements a band-variable bandpass filter 1500 and a bandpass filter controller 1600, further improved reproduction with high sound quality can be provided.

The above description for this embodiment refers to a case of a structure including an oversampling section 1200. Even when the oversampling section is not included, a similar effect can be obtained except that the extended band is limited in a comparison with the first embodiment, as a result of deciding the upper limit frequency FcH at about 24 kHz in accordance with a Nyquist condition with respect to the decode-processing section 1100. Moreover, when the oversampling section 1200 is not included, a process and a structure regarding the oversampling section can be omitted, and furthermore, the sampling frequency of the PCM data processed at the oversampling section 1100 and any of the subsequent sections is reduced to ½ in a comparison with a case including the oversampling section 1200. This can lead to a reduction in the throughput, and thus this embodiment is more effective for a case of equipping a small-scale system that will especially require power saving.

Third Embodiment

Figure 4:
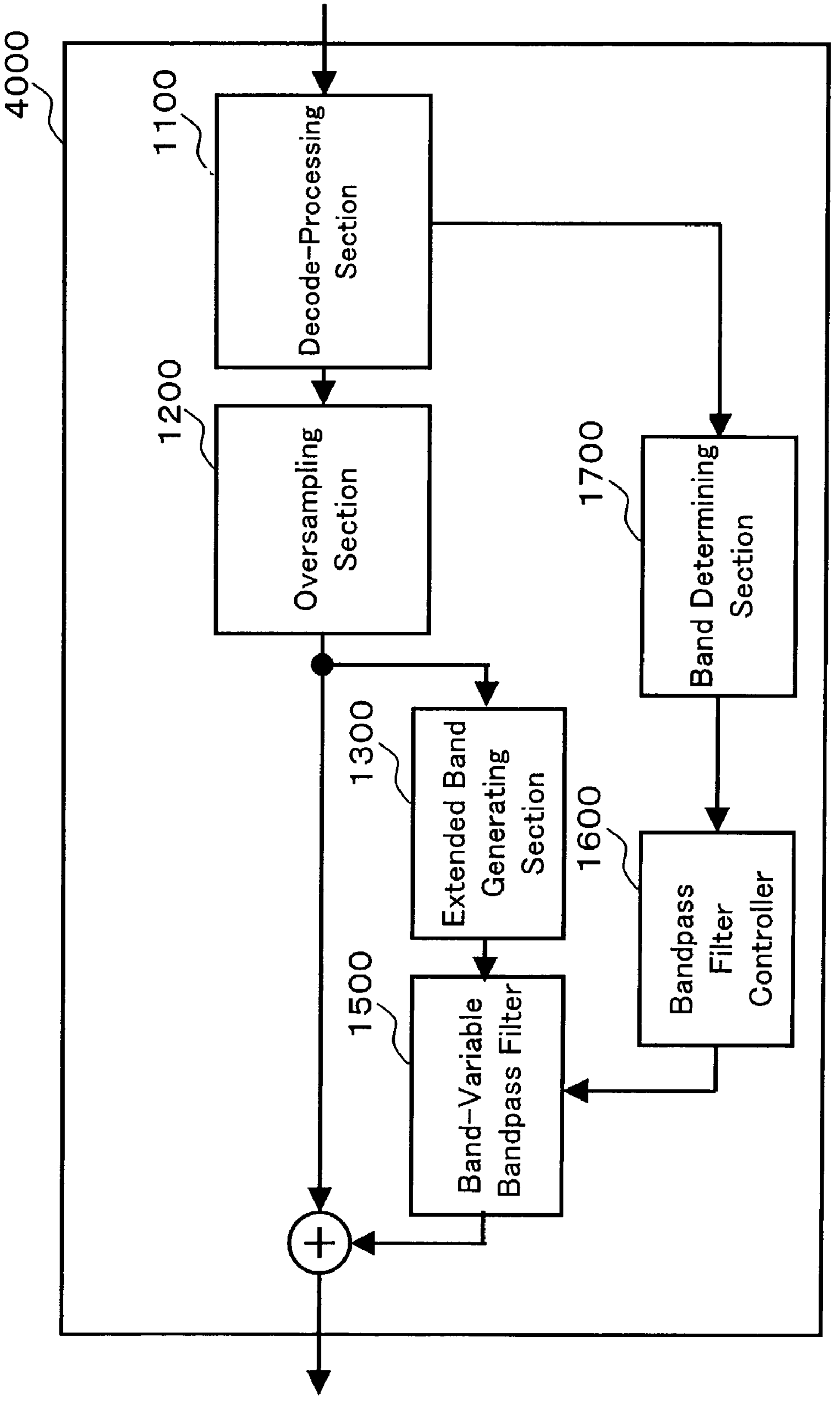
FIG. 4 is a circuit block diagram showing a structural example of an audio processing unit according to the third embodiment of the present invention.

FIG. 4 is a circuit block diagram showing a structural example of an audio processing unit according to a third embodiment of the present invention. In FIG. 4, an audio processing unit 4000 includes a decode-processing section 1100, an oversampling section 1200, an extended band generating section 1300, a band-variable bandpass filter 1500, a bandpass filter controller 1600, and a band determining section 1700.

Since the decode-processing section 1100, the oversampling section 1200, the extended band generating section 1300, and the band-variable bandpass filter 1500 respectively have the substantially same functions as in the first embodiment, detailed descriptions thereof will be omitted.

Figure 5:
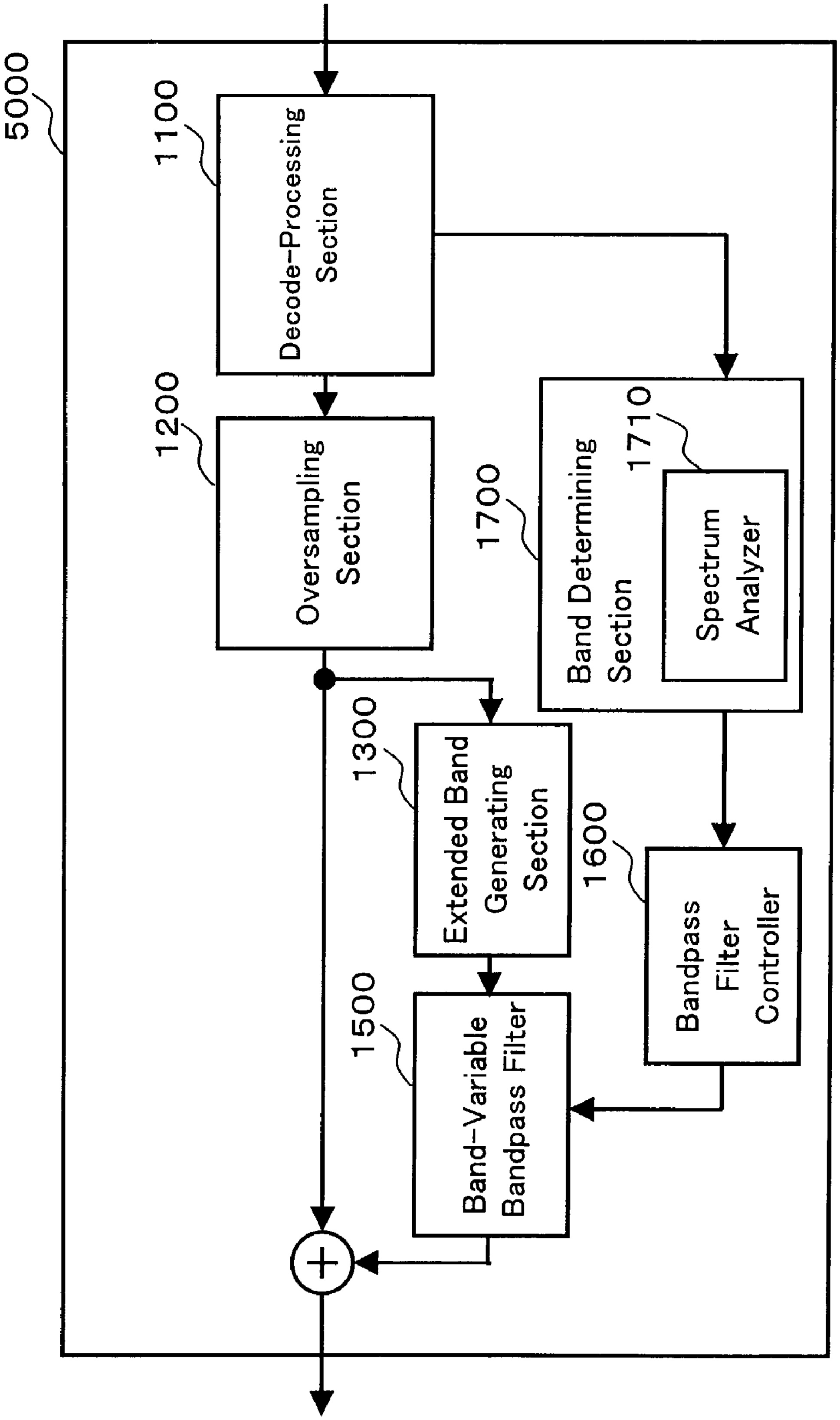
FIG. 5 is a circuit block diagram showing an example of an audio processing unit having a spectrum analyzer at the band determining section according to the third embodiment of the present invention.

The band determining section 1700 has a function of determining a band on the basis of an analysis of the frequency of the PCM data obtained from the decode-processing section 1100 and sending band determination information to the bandpass filter controller 1600. As an audio processing unit 5000 shown in FIG. 5, the band determining section 1700 in this embodiment has an internal spectrum analyzer 1710 for analyzing a frequency of PCM data.

The bandpass filter controller 1600 controls the passband of the band-variable bandpass filter 1500 in accordance with the band determination information sent from the band determining section 1700. As in the case of the first embodiment, the bandpass filter controller 1600 in this embodiment is regarded as controlling the lower limit frequency FcL of the passband of the band-variable bandpass filter 1500, and specifically it is set to enable controlling of the variable range of the FcL between FL1 and FL2.

For the thus configured audio processing unit, this embodiment refers to a case of inputting an audio signal encoded in a MPEG 1 audio standardization system where the sampling frequency is 48 kHz so as to decode the encoded signal into an audio signal. For facilitating the explanation, the band property in this embodiment deteriorates to 16 kHz or lower due to the compression process at the time of encoding.

In this case, the PCM data decoded by the decode-processing section 1100 in this embodiment has a band property of at most 16 kHz due to the above-mentioned encoding condition, and the oversampling process by the oversampling section 1200 and generation of a band extension component by the extended band generating section 1300 are performed as in the first embodiment. Therefore, detailed description of these components are omitted.

The band determining section 1700 conducts a frequency analysis with respect to the PCM data from the decode-processing section 1100, using the spectrum analyzer 1710 (FIG. 5), generates band determination information from the analytical result with respect to the PCM data, and sends the band determination information to the bandpass filter controller 1600.

The bandpass filter controller 1600 has a function of variably adjusting the lower limit frequency FcL of a passband of the band-variable bandpass filter 1500 on the basis of band determination information transmitted from the band determination section 1700. In this case, the lower limit frequency FcL of the passband is automatically set at about 16 kHz by the band determination information. At this time, the passband of the band-variable bandpass filter 1500 is in a range of FL2 to FcH. Therefore, as a result of an addition of the pass component and PCM data outputted from the oversampling section 1200, a band is extended with a linear and further natural band property with respect to a band of a sound source of at most about 16 kHz.

As described above, this embodiment enables controlling of an extended band by introducing as elements a band determining section 1700, a band-variable bandpass filter 1500 and a bandpass filter controller 1600, and thus, excellent reproduction with high sound quality can be provided. Moreover, since a spectrum analyzer 1710 is included in the band determining section 1700, the extended band can be controlled automatically without the need for an external control.

Figure 3:
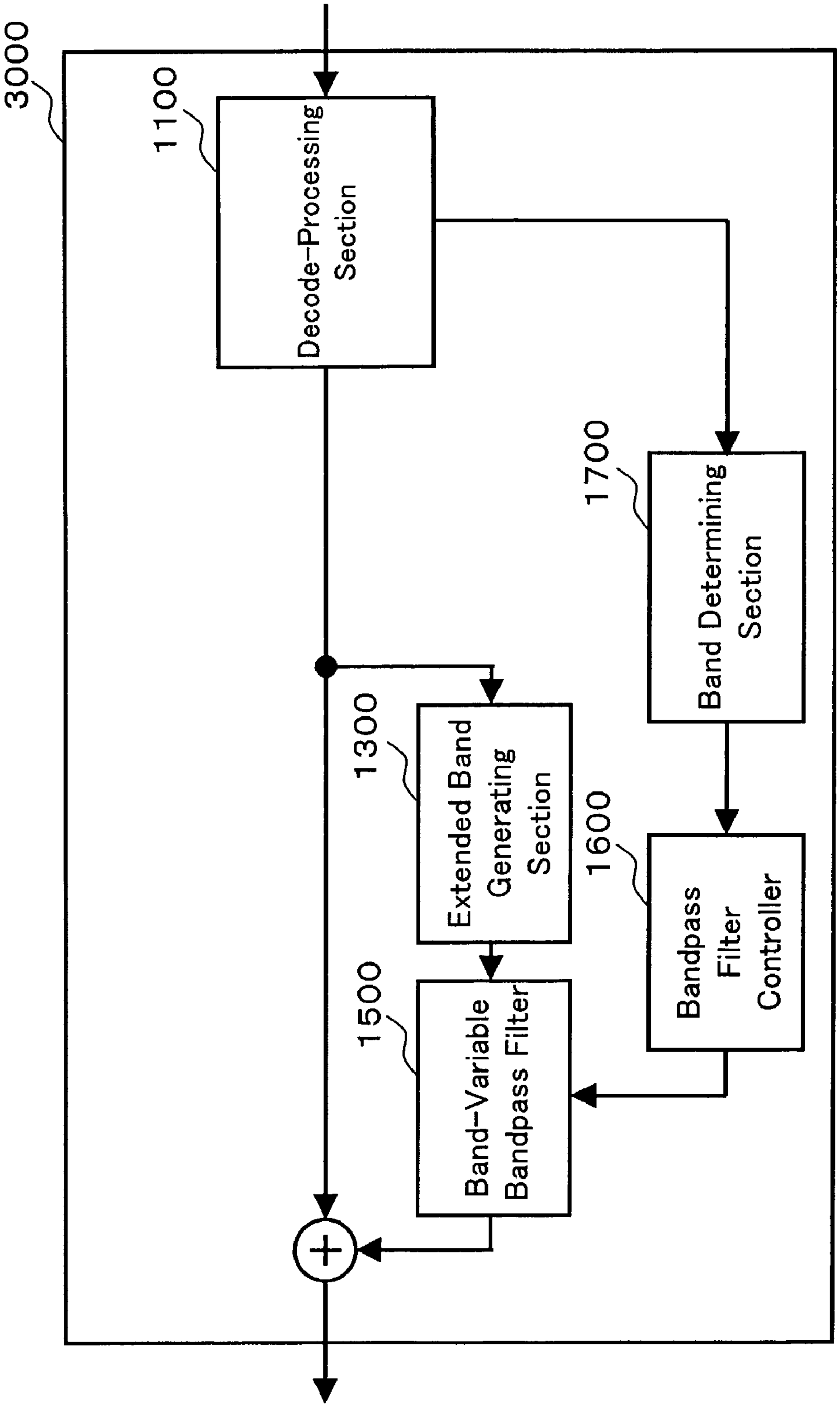
FIG. 3 is a circuit block diagram showing a structural variation of an audio processing unit according to a third embodiment of the present invention.

The above explanation about this embodiment refers to a case of including an oversampling section 1200. Even in a case including no oversampling sections, such as the audio processing unit 3000 as shown in FIG. 3, a similar effect can be obtained except that the extended band is limited in a comparison with this embodiment by deciding the upper limit frequency FcH to be about 24 kHz in accordance with a Nyquist condition with respect to the decode-processing section 1100 as in the second embodiment.

Fourth Embodiment

Figure 6:
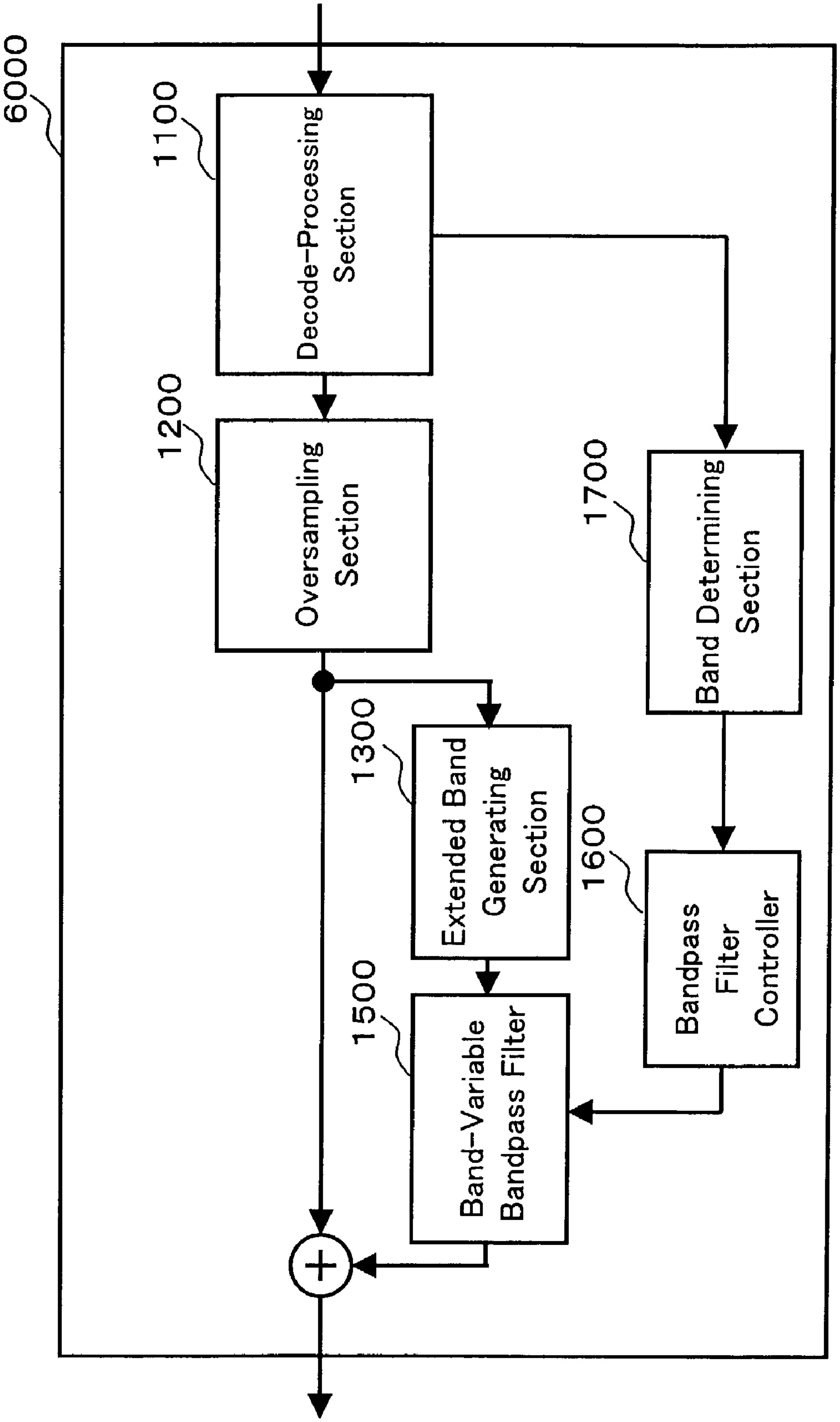
FIG. 6 is a circuit block diagram showing a structural example of an audio processing unit according to a fourth embodiment of the present invention.

FIG. 6 is a circuit block diagram showing a structural example of an audio processing unit according to a fourth embodiment of the present invention. In FIG. 6, an audio processing unit 6000 includes, as in the case of the third embodiment, a decode-processing section 1100, an oversampling section 1200, an extended band generating section 1300, a band-variable bandpass filter 1500, a bandpass filter controller 1600, and a band determining section 1700.

Figure 7:
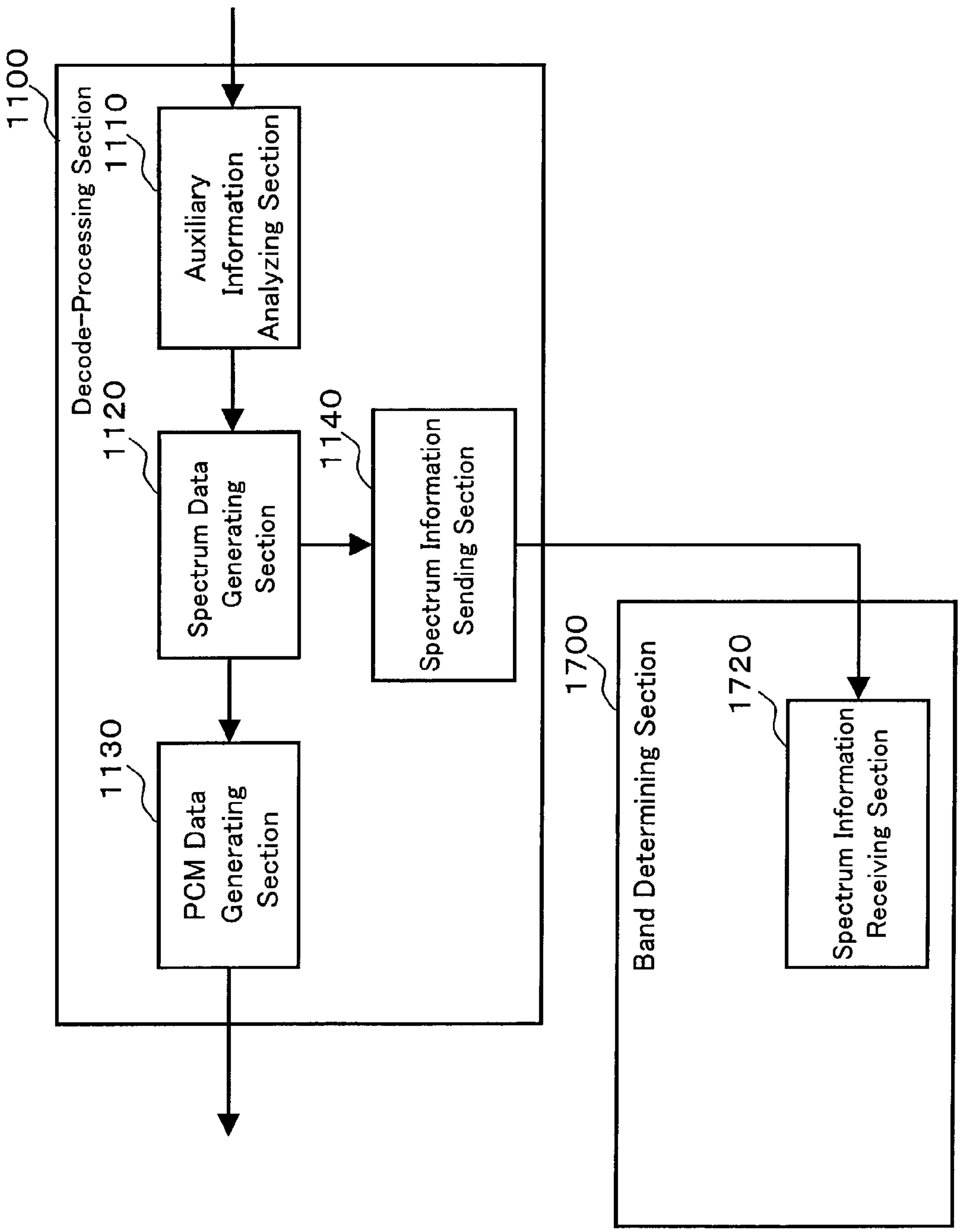
FIG. 7 is a block diagram showing an internal structure of a decode-processing section and a band determining section in the fourth embodiment of the present invention.

This embodiment is distinguished from the third embodiment in that the decode-processing section 1100 and the band determining section 1700 are configured as shown in FIG. 7.

In FIG. 7, the decode-processing section 1100 includes an auxiliary information analyzing section 1110, a spectrum data generating section 1120, a PCM data generating section 1130, and a spectrum information sending section 1140.

The auxiliary information analyzing section 1110 is a block for analyzing auxiliary information as decoding information of an input encoded signal. For example, the block performs analysis of stream header information (e.g., sampling frequency information, bit rate information, and layer information) and extraction of decoding information (e.g., bit allocation information of respective audio quantization data, and scale factor for an inverse quantization process) with respect to an encoded signal according to a MPEG audio standard.

The spectrum data generating section 1120 is a block for generating spectrum data on the basis of auxiliary information extracted by the auxiliary information analyzing section 1110, and it has a function of generating spectrum information through, for example, extraction of a quantized audio sample, an inverse quantization process, or the like.

The PCM data generating section 1130 is a block for generating PCM data from spectrum data, and it has a function of transforming spectrum data into PCM data by subjecting the respective spectrum information to any processes such as IMDCT (Inverse Modified Discrete Cosine Transform) and polyphase filter bank system.

The spectrum information sending section 1140 has a function of sending to the outside the spectrum information of the spectrum data generated at the spectrum data generating section 1120.

The band determining section 1700 includes a spectrum information receiving section 1720 for receiving the spectrum information sent from the spectrum information sending section 1140 included in the decode-processing section 1100.

For the thus configured audio processing unit, this embodiment refers to a case of inputting an audio signal encoded in a MPEG 1 audio standardization system where the sampling frequency is 48 kHz so as to decode the encoded signal into an audio signal. For facilitating the explanation, the encoding system in this embodiment is a bit stream encoded by layer 3 that is included in MPEG 1 audio standard, and the band property deteriorates to 16 kHz or lower due to a compression process at the time of encoding.

In this case, when an audio signal encoded by the MPEG 1 audio standard layer 3 is inputted to the decode-processing section 1100 according to this embodiment, analysis of auxiliary information to be decoding information of the input encoded signal is performed first at the auxiliary information analyzing section 1110. Next, at the spectrum data generating section 1120, spectrum data is generated by reading an audio quantized signal that is Huffman-coded on the basis of the stream header information and decoding information analyzed at the auxiliary information analyzing section 1110, and further inverse-quantizing of the audio quantized signal. At this time, the spectrum data generating section 1120 outputs a spectrum signal and outputs the spectrum information of the spectrum data to the spectrum information sending section 1140. Furthermore, the spectrum information sending section 1140 sends the spectrum information to the band determining section 1700.

The PCM data generating section 1130 generates 32 subband signals through an IMDCT process with respect to the spectrum data outputted from the spectrum data generating section 1120, and further generates PCM data through a band-composing operation.

In this case, the PCM data decoded by the decode-processing section 1100 in this embodiment has a band property of at most 16 kHz under the above-described encoding condition. A detailed description will be omitted regarding the oversampling process by the oversampling section 1200 and generation of a band extension component by the extended band generating section 1300, since these processes are performed as in the second and the third embodiments.

The band determining section 1700 receives, at an internal spectrum information receiving section 1720, spectrum information sent from the spectrum information sending section 1140 in the decode-processing section 1100, generates band determination information from the spectrum information, and sends the band determination information to the bandpass filter controller 1600.

Subsequently at the bandpass filter controller 1600, as in the third embodiment, the lower limit frequency FcL of the passband is variably adjusted on the basis of the band determination information transmitted from the band determining section 1700, the passband of the band-variable bandpass filter 1500 is controlled, and a band component of at least 16 kHz as an extended band signal is added to PCM data outputted from the oversampling section 1200. In this manner, a band extension process is conducted with a linear and further natural band property with respect to the band of the sound source of at most about 16 kHz.

As described above, this embodiment enables controlling of an extended band by introducing as elements a band determining section 1700, a band-variable bandpass filter 1500 and a bandpass filter controller 1600, and thus, excellent reproduction with high sound quality can be provided.

Moreover, since a spectrum information sending section 1140 is provided in the decode-processing section 1100 and a spectrum information receiving section 1720 is provided in the band determining section 1700, the extended band can be controlled automatically without the need for an external control.

In addition, the band determination process according to this embodiment is conducted using spectrum information generated through a decoding process by the decode-processing section 1100. Therefore, unlike the case of the third embodiment, an additional spectrum analyzer 1710 is not used for generating band determination information. As a result, throughput required for band determination can be reduced.

The above explanation about this embodiment refers to a case of including an oversampling section 1200. Even in a case including no oversampling sections, a similar effect can be obtained except that the extended band is limited in comparison with this embodiment by deciding the upper limit frequency FcH to be about 24 kHz in accordance with a Nyquist condition with respect to the decode-processing section 1100 as in the second and the third embodiments.

Fifth Embodiment

Figure 8:
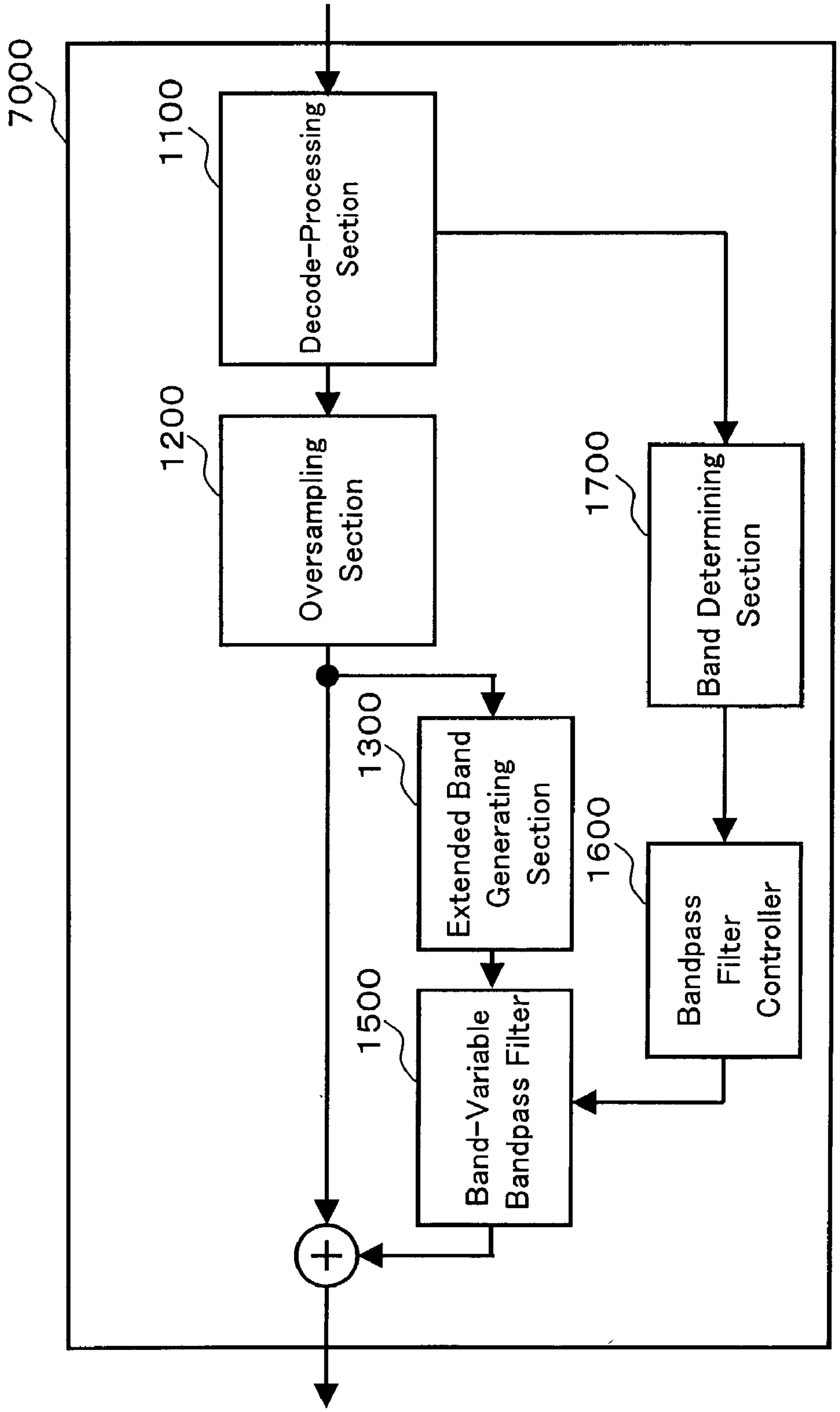
FIG. 8 is a circuit block diagram showing a structural example of an audio processing unit according to a fifth embodiment of the present invention.

FIG. 8 is a circuit block diagram showing a structural example of an audio processing unit according to a fifth embodiment of the present invention. In FIG. 8, an audio processing unit 7000 includes, as in the case of the third and the fourth embodiments, a decode-processing section 1100, an oversampling section 1200, an extended band generating section 1300, a band-variable bandpass filter 1500, a bandpass filter controller 1600, and a band determining section 1700.

Figure 9:
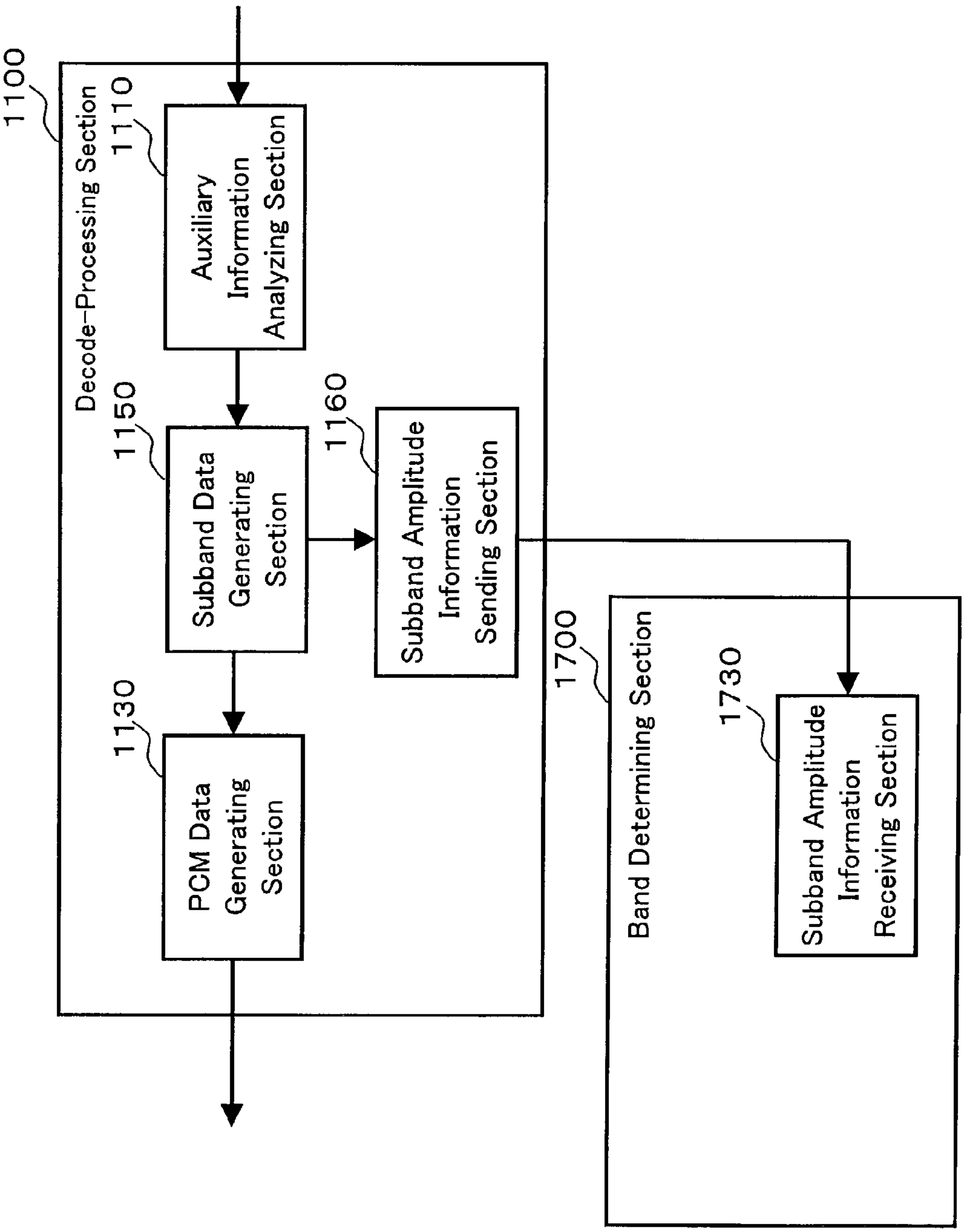
FIG. 9 is a block diagram showing an internal structure of a decode-processing section and a band determining section in the fifth embodiment of the present invention.

This embodiment is distinguished from any of the third and the fourth embodiments in that the decode-processing section 1100 and the band determining section 1700 are configured as shown in FIG. 9.

In FIG. 9, the decode-processing section 1100 includes an auxiliary information analyzing section 1110, a subband data generating section 1150, a PCM data generating section 1130, and a subband amplitude information sending section 1160.

As in the case of the fourth embodiment, the auxiliary information analyzing section 1110 is a block for analyzing auxiliary information as decoding information of an input encoded signal. For example, the block performs analysis of stream header information (e.g., sampling frequency information, bit rate information, and layer information) and extraction of decoding information (e.g., bit allocation information of respective audio quantization data, and scale factor for an inverse quantization process) with respect to an encoded signal according to a MPEG audio standard.

The subband data generating section 1150 is a block for generating subband data on the basis of auxiliary information extracted by the auxiliary information analyzing section 1110, and it has a function of generating subband data through, for example, extraction of a quantized audio sample, an inverse quantization process, or the like.

The PCM data generating section 1130 is a block for generating PCM data from the subband data, and it has a function of transforming subband data into PCM data by subjecting the respective subband signals to any band-composing processes such as polyphase filter bank system.

The subband amplitude information sending section 1160 has a function of sending to the outside the amplitude information of the subband data of the respective bands generated at the subband data generating section 1150.

The band determining section 1700 includes a subband amplitude information receiving section 1730 for receiving the amplitude information of subband data sent from the subband amplitude information sending section 1160 in the decode-processing section 1100.

For the thus configured audio processing unit, this embodiment refers to a case of inputting an audio encoded signal encoded in a MPEG 1 audio standardization system where the sampling frequency is 48 kHz so as to decode the encoded signal into an audio signal. For facilitating the explanation, the encoding system in this embodiment is a bit stream encoded by layer 2 that is included in MPEG 1 audio standard, and the band property deteriorates to 16 kHz or lower due to a compression process at the time of encoding.

In this case, when an audio signal encoded by the MPEG 1 audio standard layer 2 is inputted to the decode-processing section 1100 according to this embodiment, analysis of auxiliary information to be decoding information of the input encoded signal is performed first at the auxiliary information analyzing section 1110. Next, at the subband data generating section 1150, an audio quantized signal is extracted and inverse quantizing of the audio quantized signal is conducted on the basis of decoding information and stream header information analyzed at the auxiliary information analyzing section 1110, and thus 32 subband data are generated. At this time, the subband data generating section 1150 outputs subband data and also outputs the amplitude information of the 32 subband data to the subband amplitude information sending section 1160. Furthermore, the subband amplitude information sending section 1160 sends the amplitude information of the subband data to the band determining section 1700.

The PCM data generating section 1130 generates PCM data by subjecting the 32 subband data outputted from the subband data generating section 1150 to a band-composing operation.

In this case, the PCM data decoded by the decode-processing section 1100 in this embodiment has a band property of at most 16 kHz under the above-described encoding condition. A detailed description will be omitted regarding the oversampling by the oversampling section 1200 and generation of a band extension component by the extended band generating section 1300, since these processes are performed as in any of the second to the fourth embodiments.

The band determining section 1700 receives, at an internal subband amplitude information receiving section 1730, the subband amplitude information sent from the subband amplitude information sending section 1160 in the decode-processing section 1100, generates band determination information from the subband amplitude information, and sends the band determination information to the bandpass filter controller 1600. Subsequent operations are similar to those described in the fourth embodiment.

As described above, this embodiment enables controlling of an extended band by introducing as elements a band determining section 1700, a band-variable bandpass filter 1500 and a bandpass filter controller 1600, and thus, excellent reproduction with high sound quality can be provided.

Moreover, since a subband amplitude information sending section 1160 is provided in the decode-processing section 1100 and a subband amplitude information receiving section 1730 is provided in the band determining section 1700, the extended band can be controlled automatically without the need for an external control.

In addition, the band determination process according to this embodiment is conducted using subband amplitude information generated through a decoding process by the decode-processing section 1110. Therefore, unlike the case of the third embodiment, an additional spectrum analyzer 1710 is not used for generating band determination information. As a result, throughput required for band determination can be reduced.

The above explanation about this embodiment refers to a case of including an oversampling section 1200. Even in a case including no oversampling sections, a similar effect can be obtained except that the extended band is limited in a comparison with this embodiment by deciding the upper limit frequency FcH to be about 24 kHz in accordance with a Nyquist condition with respect to the decode-processing section 1100 as in any of the second to the fourth embodiments.

Sixth Embodiment

Figure 10:
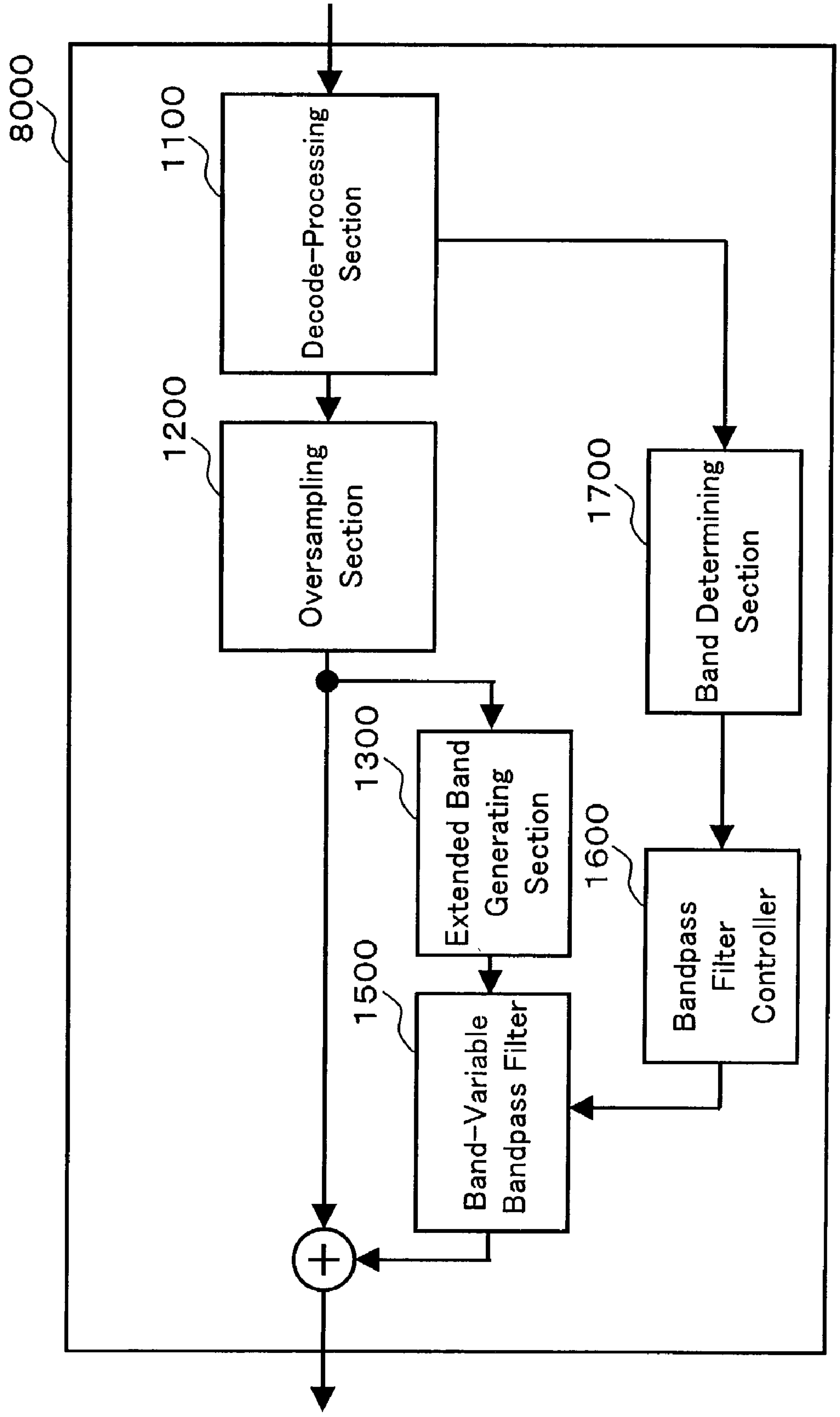
FIG. 10 is a circuit block diagram showing a structural example of an audio processing unit according to a sixth embodiment of the present invention.

FIG. 10 is a circuit block diagram showing a structural example of an audio processing unit according to a sixth embodiment of the present invention. In FIG. 10, an audio processing unit 8000 includes, as in the case of any of the third to the fifth embodiments, a decode-processing section 1100, an oversampling section 1200, an extended band generating section 1300, a band-variable bandpass filter 1500, a bandpass filter controller 1600, and a band determining section 1700.

Figure 11:
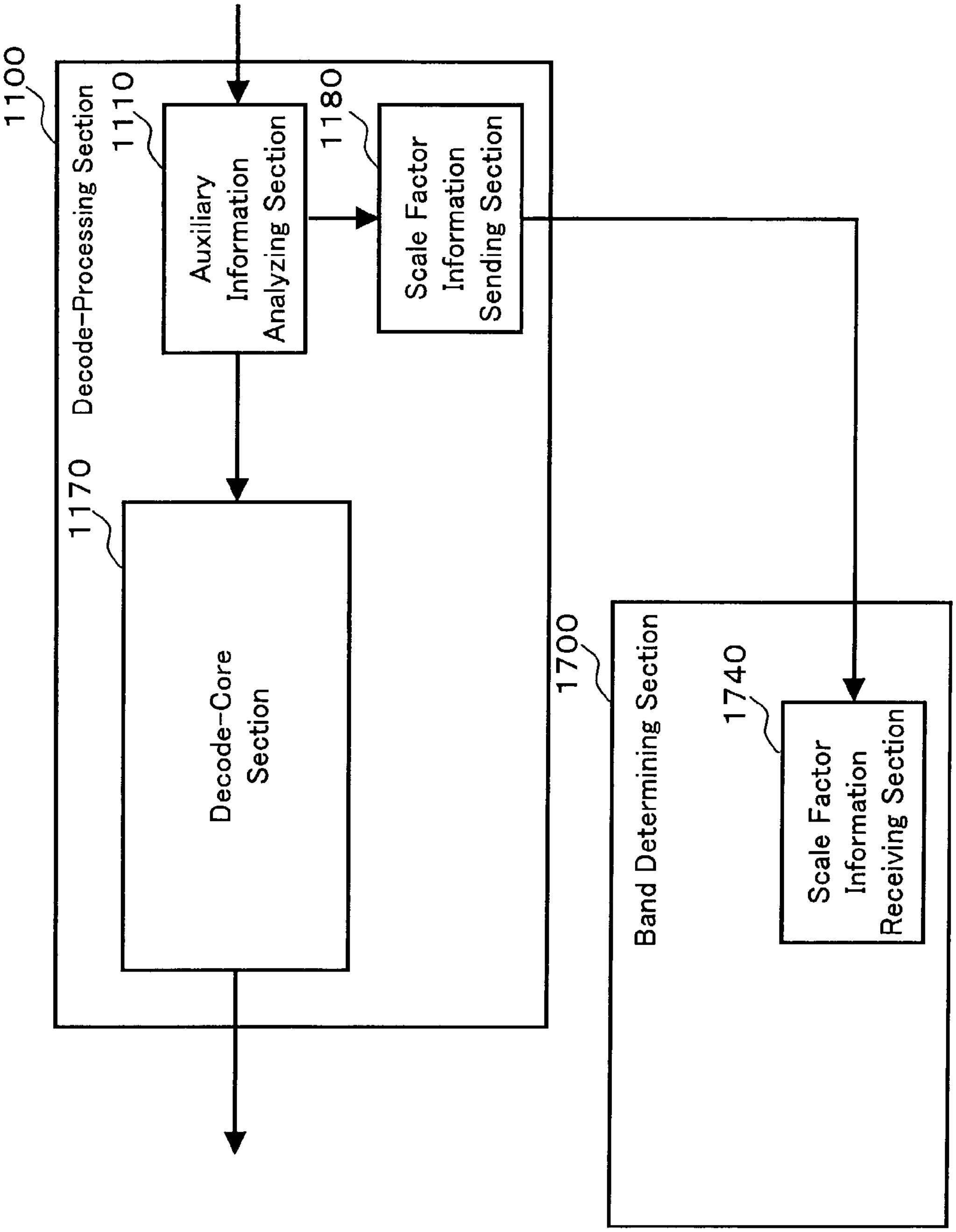
FIG. 11 is a block diagram showing an internal structure of a decode-processing section and a band determining section in the sixth embodiment of the present invention.

This embodiment is distinguished from any of the third and the fifth embodiments in that the decode-processing section 1100 and the band determining section 1700 are configured as shown in FIG. 11.

In FIG. 11, the decode-processing section 1100 includes an auxiliary information analyzing section 1110, a decode-core section 1170, and a scale factor information sending section 1180.

As in the case of the fourth and the fifth embodiments, the auxiliary information analyzing section 1110 is a block for analyzing auxiliary information as decoding information of an input encoded signal. For example, the block performs analysis of stream header information (e.g., sampling frequency information, bit rate information, and layer information) and extraction of decoding information (e.g., bit allocation information of respective audio quantization data, and scale factor for an inverse quantization process) with respect to an encoded signal according to a MPEG audio standard. The block conducts at least extraction of scale factor information and outputting it to the scale factor information sending section 1180.

The decode-core section 1170 conducts decoding and generates PCM data on the basis of auxiliary information extracted by the auxiliary information analyzing section 1110.

The scale factor information sending section 1180 has a function of sending to the outside the scale factor information generated at the auxiliary information analyzing section 1110.

The band determining section 1700 includes a scale factor information receiving section 1740 for receiving the scale factor information sent from the scale factor information sending section 1180 in the decode-processing section 1110.

For the thus configured audio processing unit, this embodiment refers to a case of inputting an audio signal encoded in a MPEG 1 audio standardization system where the sampling frequency is 48 kHz so as to decode the encoded signal into an audio signal. For facilitating the explanation, the encoding system in this embodiment is a bit stream encoded by layer 2 that is included in MPEG 1 audio standard, and the band property deteriorates to 16 kHz or lower due to a compression process at the time of encoding.

In this case, when an audio signal encoded by the MPEG 1 audio standard layer 2 is inputted to the decode-processing section 1100 according to this embodiment, analysis of auxiliary information to be decoding information of the input encoded signal is performed first at the auxiliary information analyzing section 1110. At this time, at the auxiliary information analyzing section 1110, at least extraction of scale factor information and outputting it to the scale factor information sending section 1180 are conducted.

Next, the decode-core section 1170 conducts a decoding process on the basis of auxiliary information extracted by the auxiliary information analyzing section 1110 so as to generate PCM data.

In this case, the PCM data decoded by the decode-processing section 1100 in this embodiment has a band property of at most 16 kHz under the above-described encoding condition. A detailed description will be omitted regarding the oversampling process by the oversampling section 1200 and generation of a band extension component by the extended band generating section 1300, since these processes are performed as in any of the second to the fifth embodiments.

The band determining section 1700 receives, at an internal scale factor information receiving section 1740, scale factor information sent from the scale factor information sending section 1180 in the decode-processing section 1100, generates band determination information from the scale factor information, and sends the band determination information to the bandpass filter controller 1600. Subsequent operations are similar to those described in the fourth embodiment.

As described above, this embodiment enables controlling of an extended band by introducing as elements a band determining section 1700, a band-variable bandpass filter 1500 and a bandpass filter controller 1600, and thus, excellent reproduction with high sound quality can be provided.

Moreover, since a scale factor information sending section 1180 is provided in the decode-processing section 1100 and a scale factor information receiving section 1740 is provided in the band determining section 1700, the extended band can be controlled automatically without the need for an external control.

In addition, the band determination process according to this embodiment is conducted using scale factor information generated through a decoding process by the decode-processing section 1100. Therefore, unlike the case of the third embodiment, an additional spectrum analyzer 1710 is not used for generating band determination information. As a result, throughput required for band determination can be reduced.

The above explanation about this embodiment refers to a case of including an oversampling section 1200. Even in a case including no oversampling sections, a similar effect can be obtained except that the extended band is limited in a comparison of this embodiment with any of the second to the fifth embodiments, by deciding the upper limit frequency FcH to be about 24 kHz in accordance with a Nyquist condition with respect to the decode-processing section 1100.

Seventh Embodiment

Figure 12:
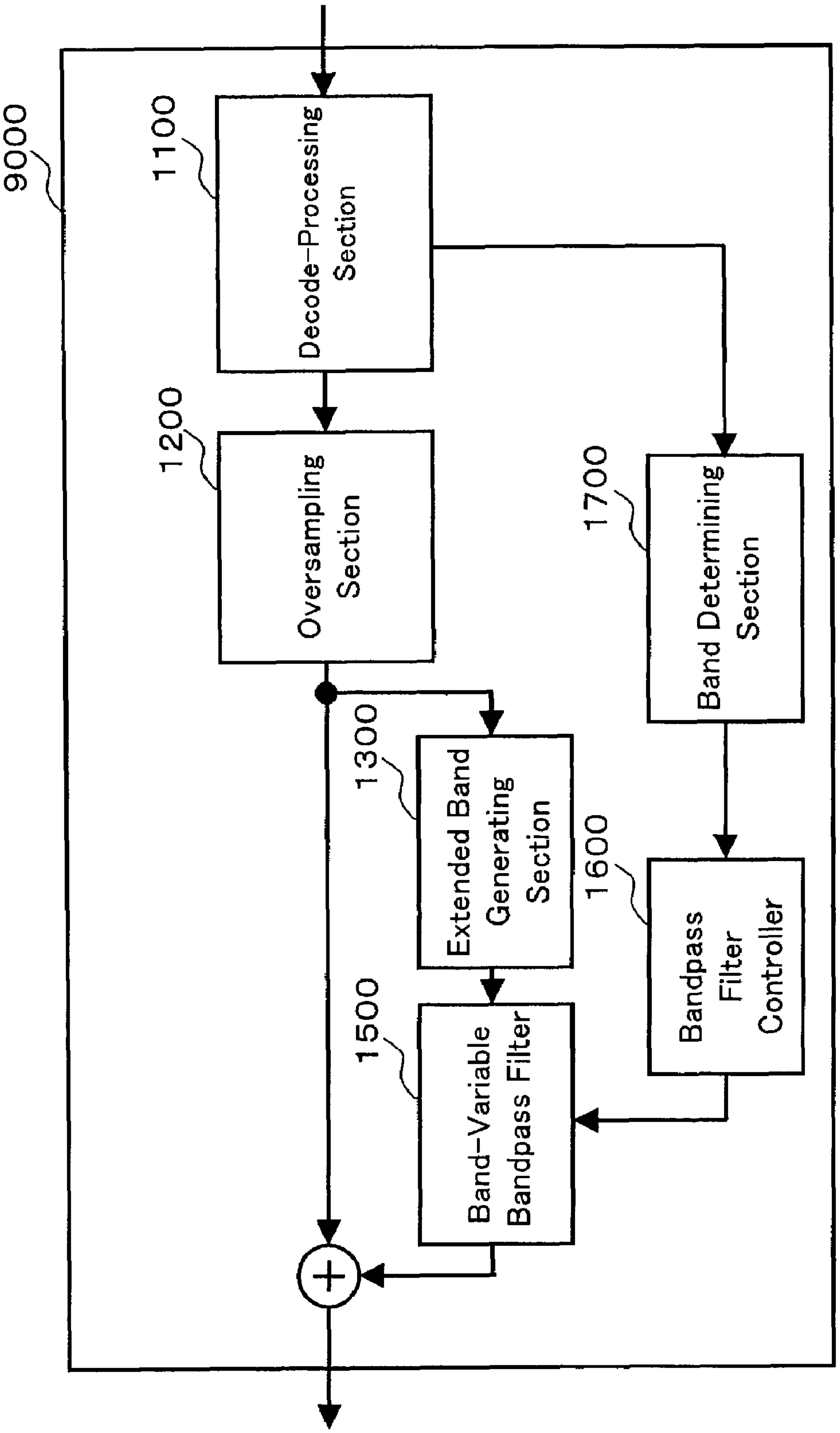
FIG. 12 is a circuit block diagram showing a structural example of an audio processing unit according to a seventh embodiment of the present invention.

FIG. 12 is a circuit block diagram showing a structural example of an audio processing unit according to a seventh embodiment of the present invention. In FIG. 12, an audio processing unit 9000 includes, as in the case of any of the third to the sixth embodiments, a decode-processing section 1100, an oversampling section 1200, an extended band generating section 1300, a band-variable bandpass filter 1500, a bandpass filter controller 1600, and a band determining section 1700.

Figure 13:
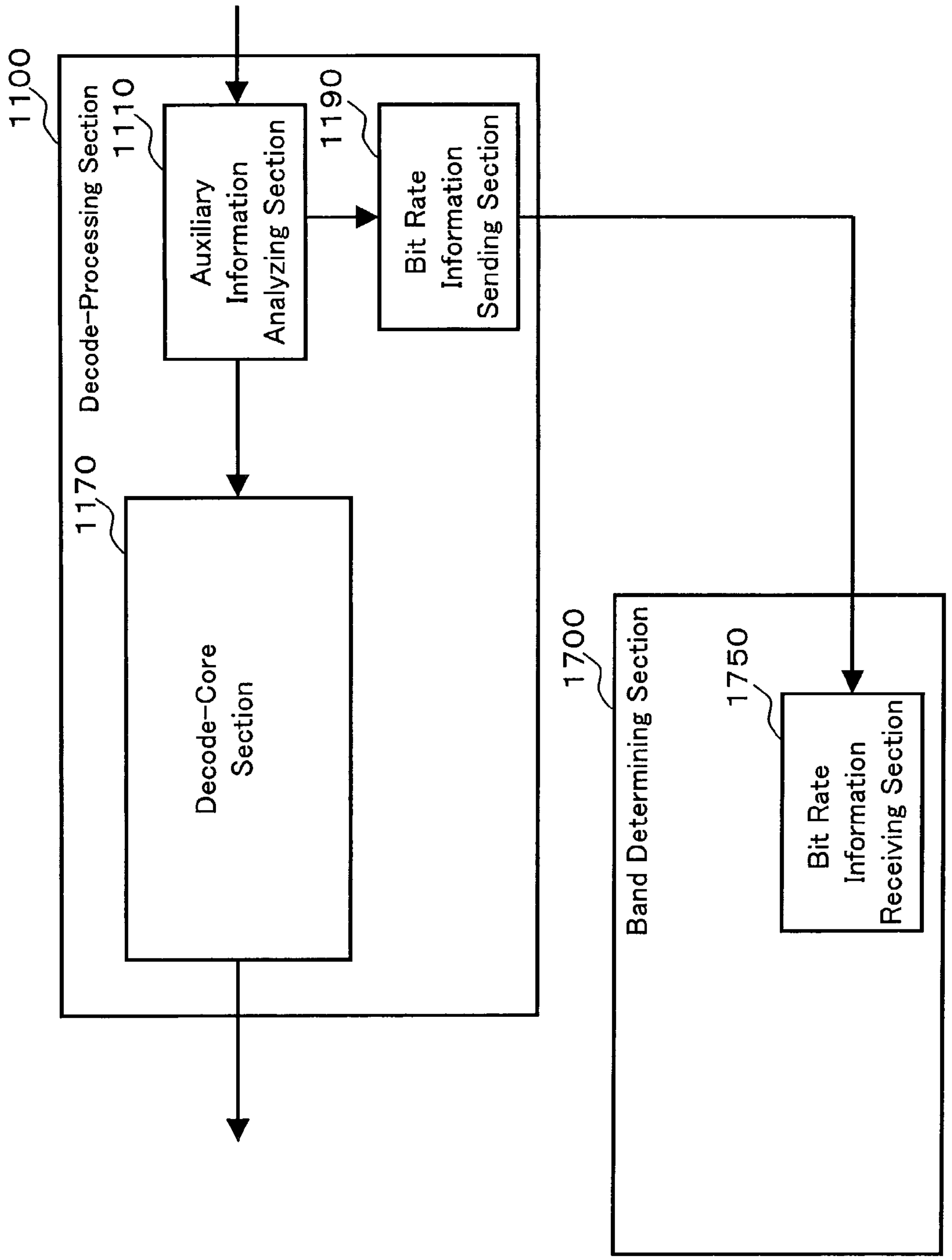
FIG. 13 is a block diagram showing an internal structure of a decode-processing section and a band determining section in the seventh embodiment of the present invention.

This embodiment is distinguished from any of the third to the sixth embodiments in that the decode-processing section 1100 and the band determining section 1700 are configured as shown in FIG. 13.

In FIG. 13, the decode-processing section 1100 includes an auxiliary information analyzing section 1110, a decode-core section 1170, and a bit rate information sending section 1190

As in the case of any of the fourth to the sixth embodiments, the auxiliary information analyzing section 1110 is a block for analyzing auxiliary information as decoding information of an input encoded signal. For example, the block performs analysis of stream header information (e.g., sampling frequency information, bit rate information, and layer information) and extraction of decoding information (e.g., bit allocation information of respective audio quantization data, and scale factor for an inverse quantization process) with respect to an encoded signal according to a MPEG audio standard. The block conducts at least extraction of bit rate information and outputs it to the bit rate information sending section 1190.

As in the case of the sixth embodiment, the decode-core section 1170 conducts decoding and generates PCM data on the basis of auxiliary information extracted by the auxiliary information analyzing section 1110.

The bit rate information sending section 1190 has a function of sending to the outside the bit rate information generated at the auxiliary information analyzing section 1110.

The band determining section 1700 includes a bit rate information receiving section 1750 for receiving the bit rate information sent from the bit rate information sending section 1190 in the decode-processing section 1110.

For the thus configured audio processing unit, this embodiment refers to a case of inputting an audio signal encoded in a MPEG 1 audio standardization system where the sampling frequency is 48 kHz so as to decode the encoded signal into an audio signal.

In this case, when an audio signal encoded by the MPEG 1 audio standard layer 2 is inputted to the decode-processing section 1100 according to this embodiment, analysis of auxiliary information to be decoding information of the input encoded signal is performed first at the auxiliary information analyzing section 1110. At this time, at the auxiliary information analyzing section 1110, at least extraction of bit rate information and outputting it to the bit rate information sending section 1190 are conducted.

Next, the decode-core section 1170 conducts a decoding process on the basis of auxiliary information extracted by the auxiliary information analyzing section 1110 so as to generate PCM data.

In this case, the PCM data decoded by the decode-processing section 1100 in this embodiment has a band property of at most 16 kHz under the above-described encoding condition. A detailed description will be omitted regarding the oversampling process by the oversampling section 1200 and generation of a band extension component by the extended band generating section 1300, since these processes are performed as in any of the second to the sixth embodiments.

The band determining section 1700 receives, at an internal bit rate information receiving section 1750, the bit rate information sent from the bit rate information sending section 1190 in the decode-processing section 1100, generates band determination information from the bit rate information, and sends the determination information to the bandpass filter controller 1600. Subsequent operations are similar to those described in the fourth embodiment.

In general, the bit rate information and PCM data to be decoded tend to have a wider frequency range as the bit rate is increased. However, a specific frequency property range is not always defined with respect to a specific bit rate. Still, by coordinating with a specific frequency property of specific bit rate information, e.g., when an encoding through a fixed bit rate is conducted, a band extension region is set fixedly. And thus, a comparatively stable band extension process will be performed.

As described above, this embodiment enables controlling of an extended band by introducing as elements a band determining section 1700, a band-variable bandpass filter 1500 and a bandpass filter controller 1600, and thus, excellent reproduction with high sound quality can be provided.

Moreover, since a bit rate information sending section 1190 is provided in the decode-processing section 1100 and a bit rate information receiving section 1750 is included in the band determining section 1700, the extended band can be controlled automatically without the need for an external control.

In addition, the band determination process according to this embodiment is conducted using bit rate information generated through a decoding process by the decode-processing section 1100. Therefore, unlike the case of the third embodiment, an additional spectrum analyzer 1710 is not used for generating band determination information. As a result, throughput required for band determination can be reduced.

Furthermore, when encoding based on a fixed bit rate is conducted by coordinating the bit rate information with a specific frequency property, a band extension region is set fixedly, and thus a comparatively stable band extension process is available.

The above explanation about this embodiment refers to a case of including an oversampling section 1200. Even in a case including no oversampling sections, a similar effect can be obtained except that the extended band is limited in a comparison of this embodiment with any of the second to the sixth embodiments, by deciding the upper limit frequency FcH to be about 24 kHz in accordance with a Nyquist condition with respect to the decode-processing section 1100.

Eighth Embodiment

Figure 14:
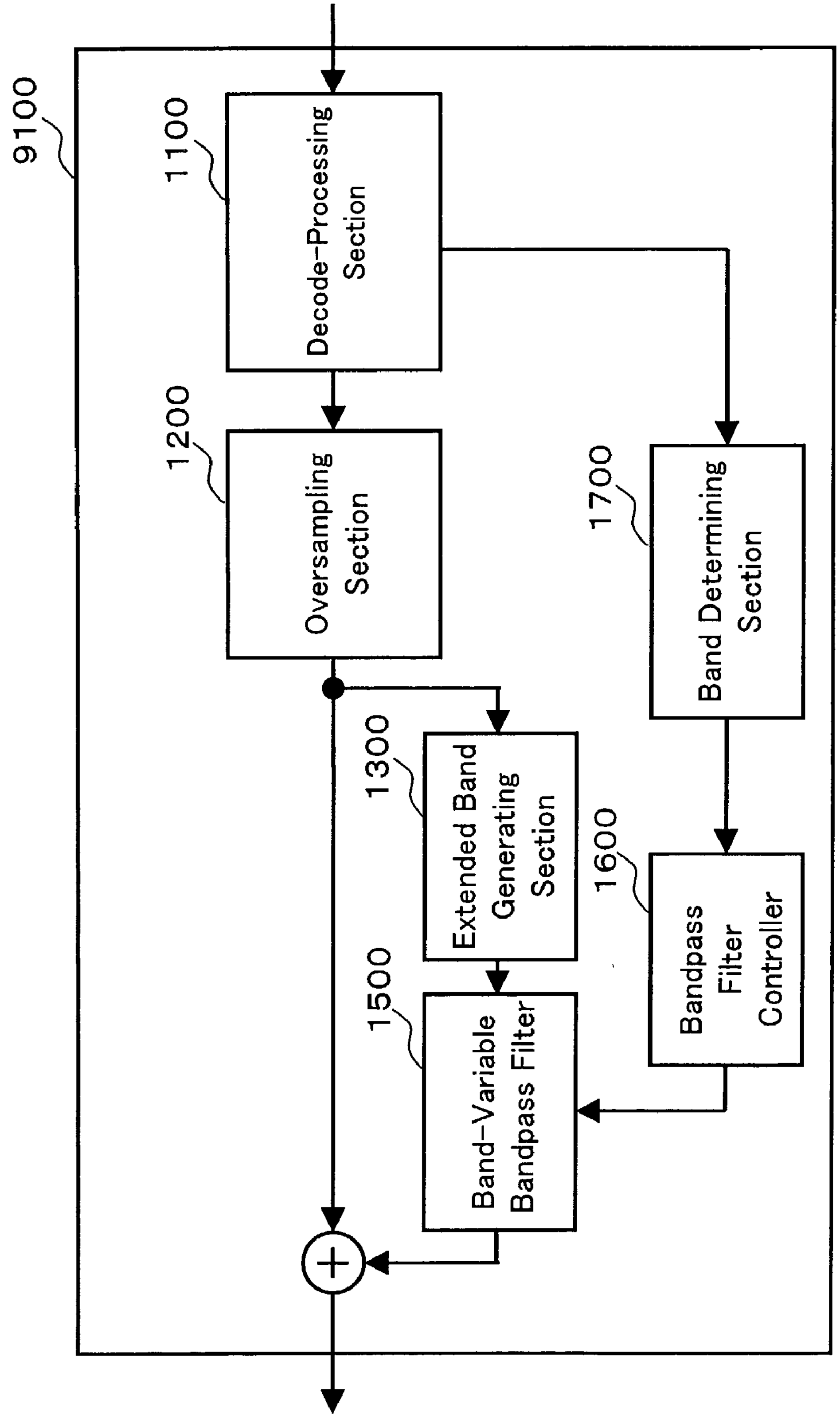
FIG. 14 is a circuit block diagram showing a structural example of an audio processing unit according to an eighth embodiment of the present invention.

FIG. 14 is a circuit block diagram showing a structural example of an audio processing unit according to an eighth embodiment of the present invention. In FIG. 14, an audio processing unit 9100 includes, as in the case of any of the third to the seventh embodiments, a decode-processing section 1100, an oversampling section 1200, an extended band generating section 1300, a band-variable bandpass filter 1500, a bandpass filter controller 1600, and a band determining section 1700.

Figure 15:
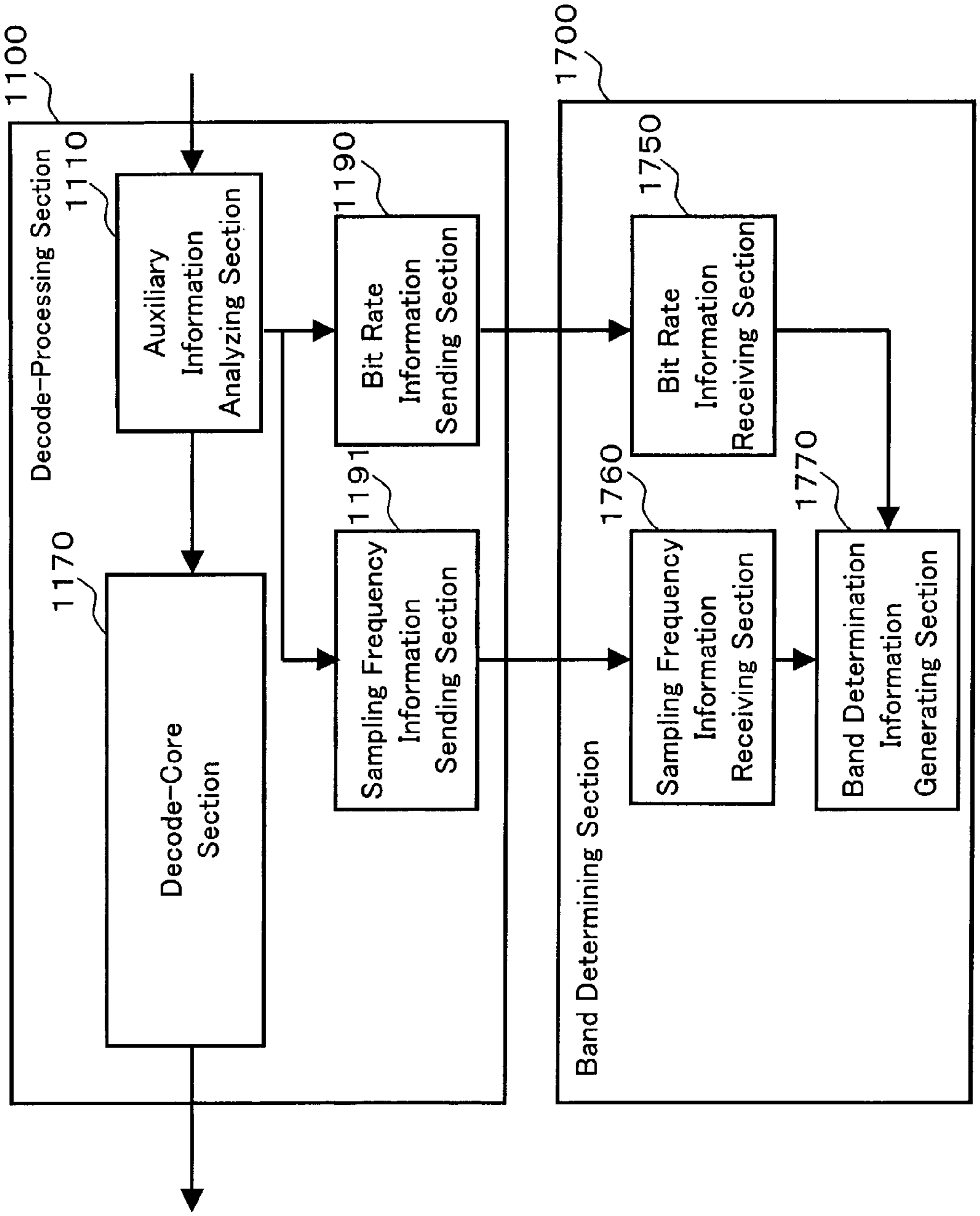
FIG. 15 is a block diagram showing an internal structure of a decode-processing section and a band determining section in the eighth embodiment of the present invention.

This embodiment is distinguished from any of the third to the seventh embodiments in that the decode-processing section 1100 and the band determining section 1700 are configured as shown in FIG. 15.

In FIG. 15, the decade-processing section 1100 includes an auxiliary information analyzing section 1110, a decode-core section 1170, a bit rate information sending section 1190, and a sampling frequency information sending section 1191.

As in the case of any of the fourth to the seventh embodiments, the auxiliary information analyzing section 1110 is a block for analyzing auxiliary information as decoding information of an input encoded signal. For example, the block performs analysis of stream header information (e.g., sampling frequency information, bit rate information, and layer information) and extraction of decoding information (e.g., bit allocation information of respective audio quantization data, and scale factor for an inverse quantization process) with respect to an encoded signal according to a MPEG audio standard. The block conducts at least extraction of bit rate information and outputting it to the bit rate information sending section 1190.

As in the case of the sixth and the seventh embodiments, the decode-core section 1170 conducts decoding and generates PCM data on the basis of auxiliary information extracted by the auxiliary information analyzing section 1110.

As in the case of the seventh embodiment, the bit rate information sending section 1190 has a function of sending to the outside the bit rate information generated at the auxiliary information analyzing section 1110.

The sampling frequency information sending section 1191 has a function of sending to the outside the sampling frequency information generated at the auxiliary information analyzing section 1110.

The band determining section 1700 includes a bit rate information receiving section 1750 for receiving the bit rate information sent from the bit rate information sending section 1190 in the decode-processing section 1110, a sampling frequency information receiving section 1760 for receiving the sampling frequency information sent from the sampling frequency information sending section 1191 in the decode-processing section 1100, and a band determination information generating section 1770.

As in the case of the seventh embodiment, the bit rate information receiving section 1750 has a function of receiving the bit rate information generated at the auxiliary information analyzing section 1110.

The sampling frequency information receiving section 1760 has a function of receiving sampling frequency information generated at the auxiliary information analyzing section 1110.

The band determination information generating section 1770 generates optimum band determination information from a combination of bit rate information sent to the bit rate information receiving section 1750 and sampling frequency information sent to the sampling frequency information receiving section 1760. This can be obtained, for example, by tabling band determination information by using as pointer information a combination of bit rate information and sampling frequency.

For the thus configured audio processing unit, this embodiment refers to a case of inputting an audio signal encoded in a MPEG 1 audio standardization system where the sampling frequency is 48 kHz so as to decode the encoded signal into an audio signal.

In this case, when an audio signal encoded by the MPEG 1 audio standard layer 2 is inputted to the decode-processing section 1100 according to this embodiment, analysis of auxiliary information to be decoding information of the input encoded signal is performed first at the auxiliary information analyzing section 1110. At this time, at the auxiliary information analyzing section 1110, at least extraction of bit rate information, outputting the bit rate information to the bit rate information sending section 1190, extraction of sampling frequency information, and outputting the sampling frequency information to the sampling information sending section 1191 are conducted.

Next, the decode-core section 1170 conducts a decoding process on the basis of auxiliary information extracted by the auxiliary information analyzing section 1110 so as to generate PCM data.

In this case, the PCM data decoded by the decode-processing section 1100 in this embodiment has a band property of at most 16 kHz under the above-described encoding condition. A detailed description will be omitted regarding the oversampling process by the oversampling section 1200, and generation of a band extension component by the extended band generating section 1300, since these processes are performed as in any of the second to the seventh embodiments.

The band determining section 1700 receives, at an internal bit rate information receiving section 1750, the bit rate information sent from the bit rate information sending section 1190 in the decode-processing section 1100. Similarly, it receives at an internal sampling frequency information receiving section 1760 the sampling frequency information sent from the sampling frequency information sending section 1191.

Next, the band determination information generating section 1770 generates optimum band determination information from a combination of bit rate information sent to the bit rate information receiving section 1750 and sampling frequency information sent to the sampling frequency information receiving section 1760. Then, the band determination information generating section 1770 sends the band determination information to the bandpass filter controller 1600. Subsequent operations are similar to those described in the fourth embodiment.

In general, the bit rate information and PCM data to be decoded tend to have a wider frequency range as the bit rate is increased. However, a specific frequency property range is not always defined with respect to a specific bit rate. Still, by coordinating with a specific frequency property of specific bit rate information, e.g., when an encoding through a fixed bit rate is conducted, a band extension region is set fixedly. And thus, a comparatively stable band extension process will be performed.

Moreover, since sampling frequency information is used as well for generating band determination information in this embodiment, further optimum band determination can be obtained in a comparison with a case of band determination process using bit rate information alone.

As described above, this embodiment enables controlling an extended band by introducing as elements a band determining section 1700, a band-variable bandpass filter 1500 and a bandpass filter controller 1600, and thus, excellent reproduction with high sound quality can be provided.

Moreover, since a bit rate information sending section 1190 and a sampling frequency information sending section 1191 are provided in the decode-processing section 1100, and a bit rate information receiving section 1750, a sampling frequency information receiving section 1760 and a band determination information generating section 1770 are provided in the band determining section 1700, the extended band can be controlled automatically without the need for an external control.

In addition, the band determination process according to this embodiment is conducted using bit rate information and sampling frequency information generated through a decoding process by the decode-processing section 1100. Therefore, unlike the case of the third embodiment, an additional spectrum analyzer is not used for generating band determination information. As a result, throughput required for band determination can be reduced.

Furthermore, when encoding based on a fixed bit rate is conducted by coordinating the bit rate with a specific frequency property, a band extension region is set fixedly, and thus a comparatively stable band extension process is available.

The above explanation about this embodiment refers to a case of including an oversampling section 1200. Even in a case including no oversampling sections, a similar effect can be obtained except that the extended band is limited in a comparison of this embodiment with any of the second to the seventh embodiments, by deciding the upper limit frequency FcH to be about 24 kHz in accordance with a Nyquist condition with respect to the decode-processing section 1100.

Ninth Embodiment

Figure 16:
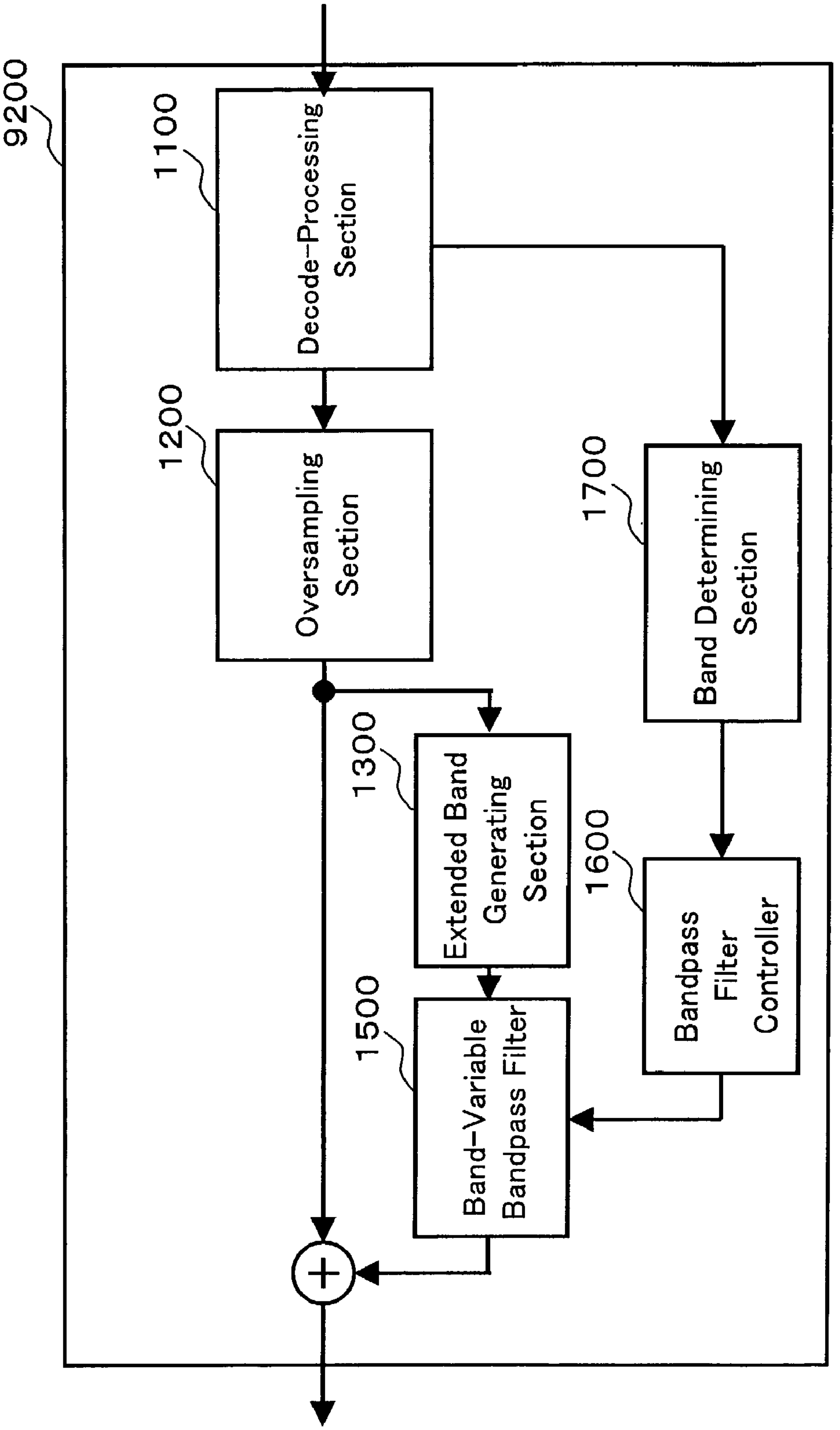
FIG. 16 is a circuit block diagram showing a structural example of an audio processing unit according to a ninth embodiment of the present invention.

FIG. 16 is a circuit block diagram showing a structural example of an audio processing unit according to a ninth embodiment of the present invention. In FIG. 16, an audio processing unit 9200 includes, as in the case of any of the third to the eighth embodiments, a decode-processing section 1100, an oversampling section 1200, an extended band generating section 1300, a band-variable bandpass filter 1500, a bandpass filter controller 1600, and a band determining section 1700.

Figure 17:
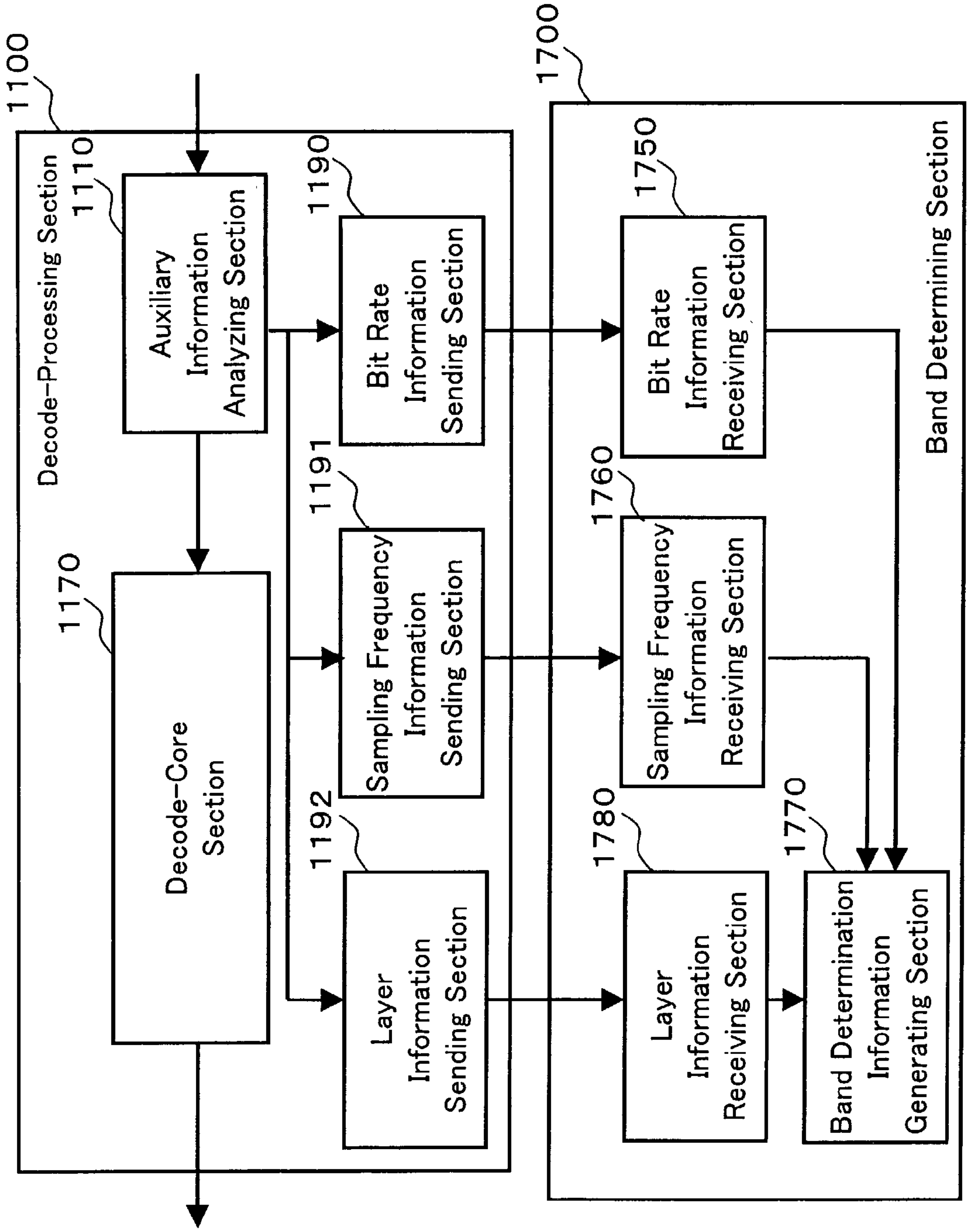
FIG. 17 is a block diagram showing an internal structure of a decode-processing section and a band determining section in the ninth embodiment of the present invention.

This embodiment is distinguished from any of the third to the eighth embodiments in that the decode-processing section 1100 and the band determining section 1700 are configured as shown in FIG. 17.

In FIG. 17, the decode-processing section 1100 includes an auxiliary information analyzing section 1110, a decode-core section 1170, a bit rate information sending section 1190, a sampling frequency information sending section 1191, and a layer information sending section 1192.

As in the case of any of the fourth to the eighth embodiments, the auxiliary information analyzing section 1110 is a block for analyzing auxiliary information as decoding information of an input encoded signal. For example, the block performs analysis of stream header information (e.g., sampling frequency information, bit rate information, and layer information) and extraction of decoding information (e.g., bit allocation information of respective audio quantization data, and scale factor for an inverse quantization process) with respect to an encoded signal according to a MPEG audio standard. The block conducts at least extraction of bit rate information and outputting it to the bit rate information sending section 1190.

As in the case of any of the sixth to the eighth embodiments, the decode-core section 1170 conducts decoding and generates PCM data on the basis of auxiliary information extracted by the auxiliary information analyzing section 1110.

As in the case of the seventh embodiment, the bit rate information sending section 1190 has a function of sending to the outside the bit rate information generated at the auxiliary information analyzing section 1110.

The sampling frequency information sending section 1191 has a function of sending to the outside the sampling frequency information generated at the auxiliary information analyzing section 1110.

The layer information sending section 1192 has a function of sending layer information generated at the auxiliary information analyzing section 1110 to the outside.

The band determining section 1700 includes a bit rate information receiving section 1750 for receiving the bit rate information sent from the bit rate information sending section 1190 in the decode-processing section 1110, a sampling frequency information receiving section 1760 for receiving the sampling frequency information sent from the sampling frequency information sending section 1191 in the decode-processing section 1100, a layer information receiving section 1780 for receiving the layer information sent from the layer information sending section 1192 in the decode-processing section 1100, and a band determination information generating section 1770.

As in the case of the seventh embodiment, the bit rate information receiving section 1750 has a function of receiving the bit rate information generated at the auxiliary information analyzing section 1110.

The sampling frequency information receiving section 1760 has a function of receiving sampling frequency information generated at the auxiliary information analyzing section 1110.

The layer information receiving section 1780 has a function of receiving layer information generated at the auxiliary information analyzing section 1110.

The band determination information generating section 1770 generates optimum band determination information from a combination of bit rate information sent to the bit rate information receiving section 1750, sampling frequency information sent to the sampling frequency information receiving section 1760, and layer information sent to the layer information receiving section 1780. This can be obtained, for example, by tabling band determination information by using as pointer information a combination of bit rate information, sampling frequency, and layer information.

For the thus configured audio processing unit, this embodiment refers to a case of inputting an audio signal encoded in a MPEG 1 audio standardization system where the sampling frequency is 48 kHz so as to decode the encoded signal into an audio signal.

In this case, when an audio signal encoded by the MPEG 1 audio standard layer 2 is inputted to the decode-processing section 1100 according to this embodiment, analysis of auxiliary information to be decoding information of the input encoded signal is performed first at the auxiliary information analyzing section 1110. At this time, at the auxiliary information analyzing section 1110, at least extraction of bit rate information, outputting the bit rate information to the bit rate information sending section 1190, extraction of sampling frequency information, outputting the sampling information to the sampling information sending section 1191, extraction of layer information, and outputting the layer information to the layer information receiving section 1780 are conducted.

Next, the decode-core section 1170 conducts a decoding process on the basis of auxiliary information extracted by the auxiliary information analyzing section 1110 so as to generate PCM data.

In this case, the PCM data decoded by the decode-processing section 1100 in this embodiment has a band property of at most 16 kHz under the above-described encoding condition. A detailed description will be omitted regarding the oversampling process by the oversampling section 1200, and generation of a band extension component by the extended band generating section 1300, since these processes are performed as in any of the second to the seventh embodiments.

The band determining section 1700 receives, at an internal bit rate information receiving section 1750, the bit rate information sent from the bit rate information sending section 1190 in the decode-processing section 1100, receives at the internal sampling frequency information receiving section 1760 sampling frequency information sent from the sampling frequency information sending section 1191, and receives at the internal layer information receiving section 1780 layer information sent from the layer information sending section 1192.

Next, the band determination information generating section 1770 generates optimum band determination information from a combination of bit rate information sent to the bit rate information receiving section 1750, sampling frequency information sent to the sampling frequency information receiving section 1760, and layer information sent to the layer information receiving section 1780. Then, the band determination information generating section 1770 sends the band determination information to the bandpass filter controller 1600. Subsequent operations are similar to those described in the fourth embodiment.

In general, the bit rate information and PCM data to be decoded tend to have a wider frequency range as the bit rate is increased. However, a specific frequency property range is not always defined with respect to a specific bit rate. Still, by coordinating with a specific frequency property of specific bit rate information, e.g., when an encoding through a fixed bit rate is conducted, a band extension region is set fixedly. And thus, a comparatively stable band extension process will be performed.

Furthermore, in a comparison with the eighth embodiment, this embodiment enables optimum band determination because of its band determination information including layer information. For example, according to MPEG audio standards ISO/IEC 11172-3:1993 and 13818-3:1996, the bit rate for layer 2 is different from that for layer 3 even when the bit rate indices are the same. Therefore, more precise band determination can be obtained by using layer information for the band determination.

As described above, this embodiment enables controlling an extended band by introducing as elements a band determining section 1700, a band-variable bandpass filter 1500 and a bandpass filter controller 1600, and thus, excellent reproduction with high sound quality can be provided.

Moreover, since a bit rate information sending section 1190, a sampling frequency information sending section 1191, and a layer information sending section 1192 are provided in the decode-processing section 1100, and a bit rate information receiving section 1750, a sampling frequency information receiving section 1760, a layer information receiving section 1780 and a band determination information generating section 1770 are provided in the band determining section 1700, the extended band can be controlled automatically without the need for an external control.

In addition, the band determination process according to the present invention is conducted using bit rate information, sampling frequency information and layer information generated through a decoding process by the decode-processing section 1100. Therefore, unlike the third embodiment, an additional spectrum analyzer 1710 is not used for generating band determination information. As a result, throughput required for band determination can be reduced.

Furthermore, when encoding based on a fixed bit rate is conducted by coordinating the bit rate with a specific frequency property, a band extension region is set fixedly, and thus a comparatively stable band extension process is available.

The above explanation about this embodiment refers to a case of including an oversampling section 1200. Even in a case including no oversampling sections, a similar effect can be obtained except that the extended band is limited in a comparison of this embodiment with any of the first to the fifth embodiments by deciding the upper limit frequency FcH to be about 24 kHz in accordance with a Nyquist condition with respect to the decode-processing section 1100.

Tenth Embodiment

Figure 18:
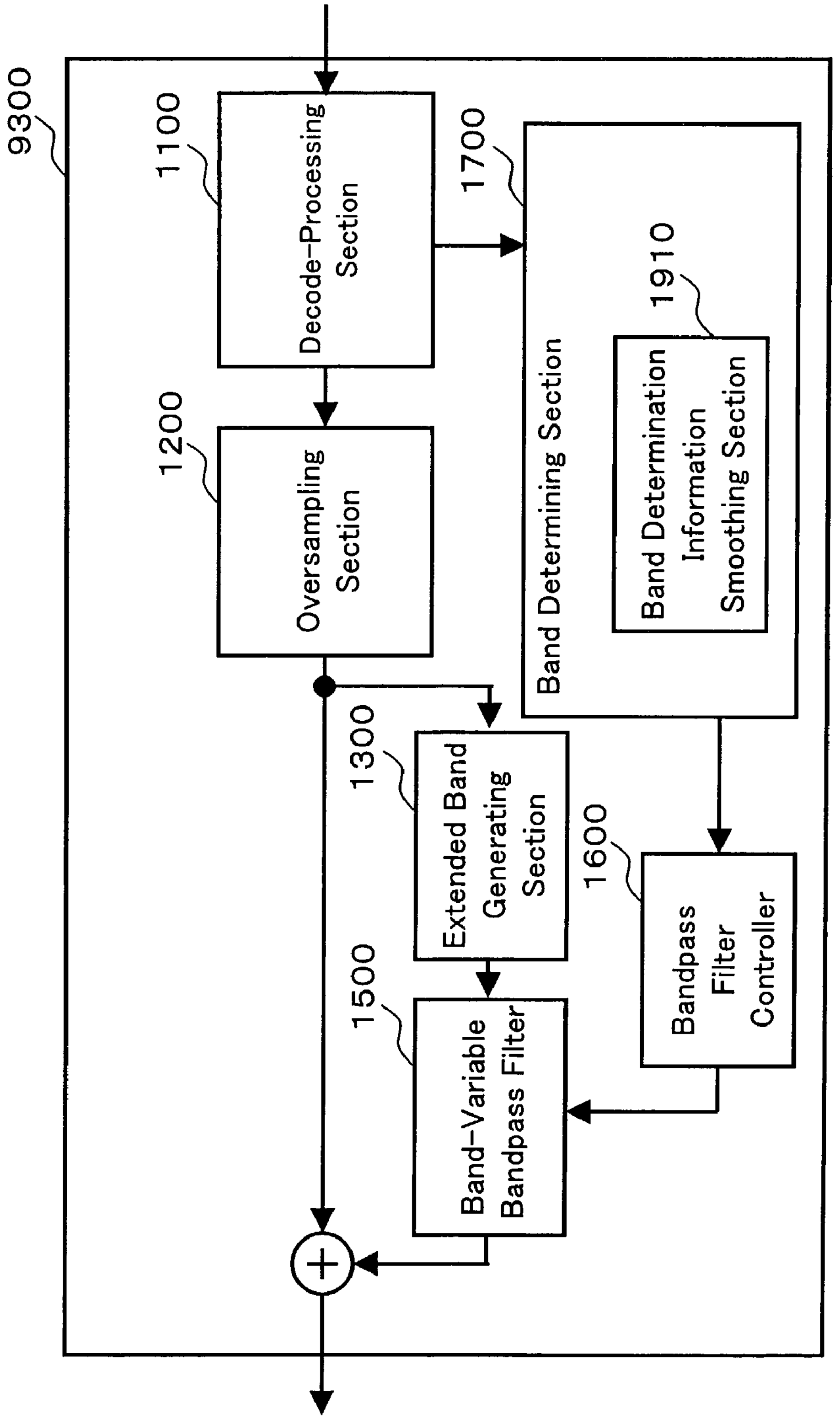
FIG. 18 is a circuit block diagram showing a structural example of an audio processing unit according to a tenth embodiment of the present invention.

FIG. 18 is a circuit block diagram showing a structural example of an audio processing unit according to a tenth embodiment of the present invention. In FIG. 18, an audio processing unit 9300 includes, as in the case of any of the third to the ninth embodiments, a decode-processing section 1100, an oversampling section 1200, an extended band generating section 1300, a band-variable bandpass filter 1500, a bandpass filter controller 1600, and a band determining section 1700.

This embodiment is distinguished from any of the third to the ninth embodiments in that a band determination information smoothing section 1910 is included as an element in the band determining section 1700.

The band determination smoothing section 1910 has a function of smoothing band determination information sent from the decode-processing section 1100, and it functions to suppress the degree of changes by smoothing even when the band determination information varies rapidly. Smoothing can be conducted easily, for example, by mixing the pre-processed data at a fixed rate by use of a IIR filter as in a time constant circuit.

The following is a description about an operation of the thus configured audio processing unit. When an audio encoded signal is inputted to the decode-processing section according to this embodiment, it is decoded by the decode-processing section 1100 so that PCM data are outputted. For facilitating the explanation, band determination information in this embodiment is regarded as spectrum information.

The band determining section 1700 analyzes frequency regarding the PCM data from the decode-processing section 1100 on the basis of decoding information from the decode-processing section 1100, generates band determination information with respect to the PCM data from the analytical result, and further conducts smoothing by using the band determination information smoothing section 1910, and then sends the band determination information to the bandpass filter controller 1600.

At the band determining section 1700, responsivity of the band extension process with respect to the frequency property of the PCM data decoded by the decode-processing section 1100 is decreased by the smoothing at the band determination information smoothing section 1910. However, this smoothing can reduce variation in the band extension region and provide a comparatively stable band extension process when the frequency property of the PCM data changes remarkably.

By arranging a band determination information smoothing section 1910, excess changes of the band extension region can be suppressed automatically with respect to the frequency variation of the reproduced PCM data. Accordingly, a stable reproduction of a band extension can be obtained comparatively easily.

Eleventh Embodiment

Figure 19:
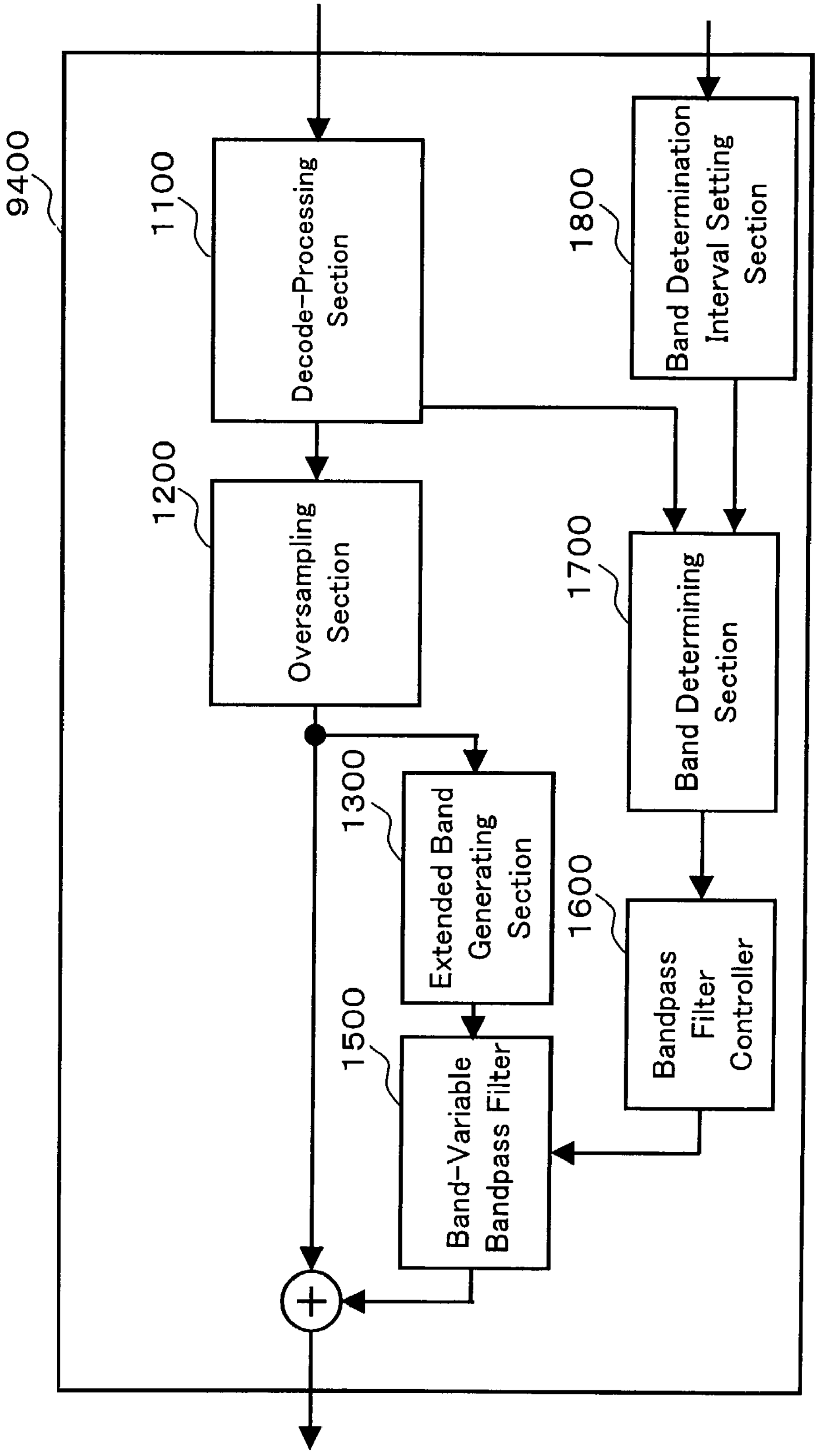
FIG. 19 is a circuit block diagram showing a structural example of an audio processing unit according to an eleventh embodiment of the present invention.

FIG. 19 is a circuit block diagram showing a structural example of an audio processing unit according to an eleventh embodiment of the present invention. In FIG. 19, an audio processing unit 9400 includes, as in the case of any of the third to the tenth embodiments, a decode-processing section 1100, an oversampling section 1200, an extended band generating section 1300, a band-variable bandpass filter 1500, a bandpass filter controller 1600, and a band determining section 1700.

This embodiment is distinguished from any of the third to the tenth embodiments in that a band determination interval setting section 1800 is included further in the audio processing unit 9400.

The band determination interval setting section 1800 has a function of setting a time interval for a band determination process at the band determining section 1700 in accordance with an external input, and the band determining section 1700 performs a band determination process corresponding to the interval time of the band determination indicated by the band determination interval setting section 1800.

The following is a description about an operation of the thus configured audio processing unit. When an audio encoded signal is inputted to the decode-processing section 1100 according to this embodiment, it is decoded by the decode-processing section 1100 so that PCM data are outputted.

The band determining section 1700 analyzes frequency regarding the PCM data from the decode-processing section 1100 on the basis of decoding information from the decode-processing section 1100, generates band determination information with respect to the PCM data from the analytical result, and then sends the band determination information to the bandpass filter controller 1600.

At the band determining section 1700, a time interval for the band determination process is set previously from the outside through the band determination interval setting section 1800.

Therefore, when the time interval indicated from the outside is set to be shorter, the response to the decoding information from the decode-processing section 1100 will be acute, resulting in a high responsivity of the band extension process with respect to the frequency property of the PCM data decoded by the decode-processing section 1100.

When the time interval indicated from the outside is set to be longer, the responsivity of the band extension process with respect to the frequency property of the PCM data decoded by the decode-processing section 1100 will be low. However, for a case in which the frequency property of the PCM data changes remarkably, the variation in the band extension region is decreased due to the long interval of the band determination process, and thus a comparatively stable band extension process can be obtained.

As described above, the band determination interval setting section 1800 enables adjustment of a band extension process in accordance with the characteristics of the PCM data to be produced, the user's preferences or the like.

Twelfth Embodiment

Figure 20:
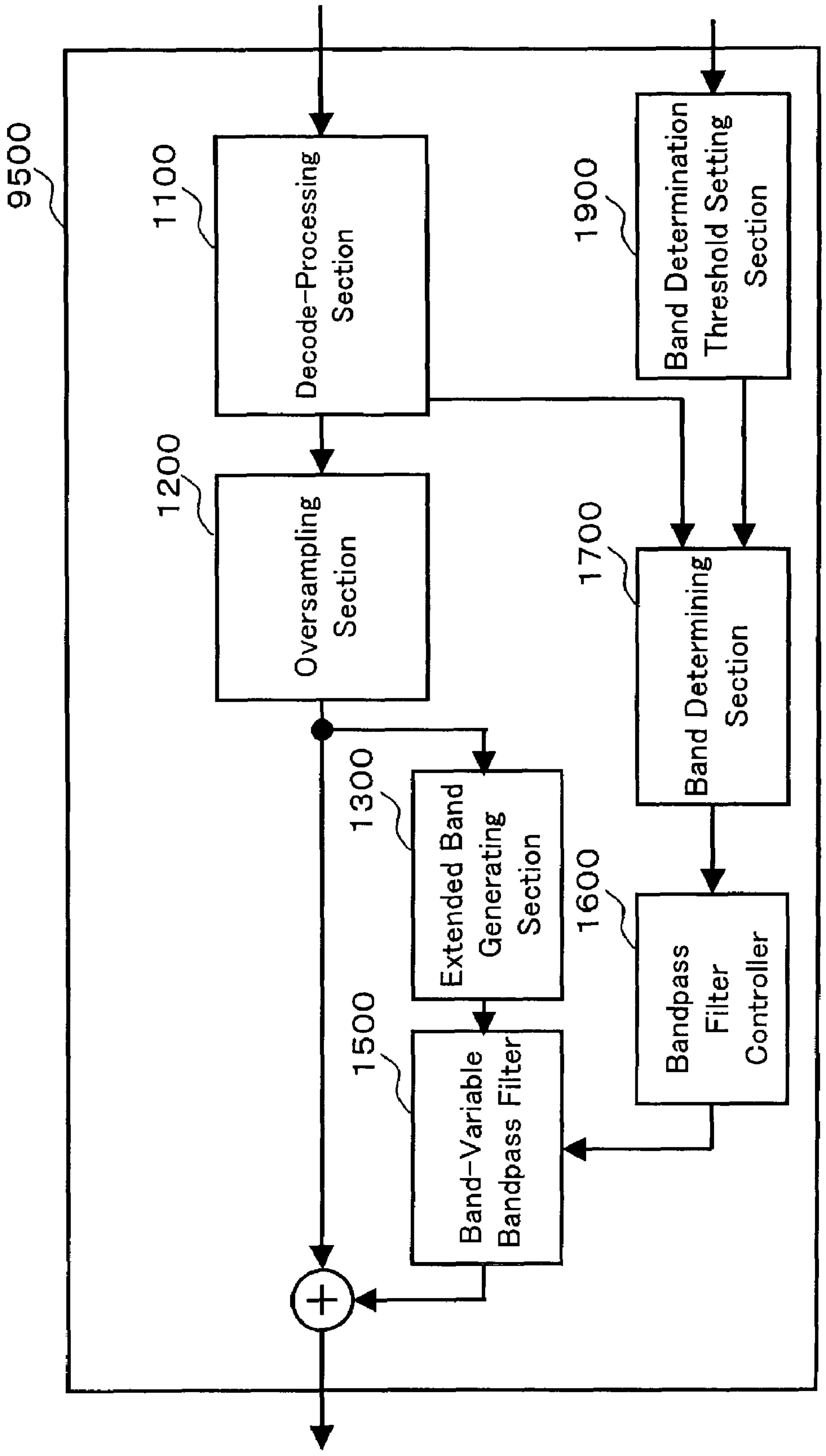
FIG. 20 is a circuit block diagram showing a structural example of an audio processing unit according to a twelfth embodiment of the present invention.

FIG. 20 is a circuit block diagram showing a structural example of an audio processing unit according to a twelfth embodiment of the present invention. In FIG. 20, an audio processing unit 9500 includes, as in the case of any of the third to the eleventh embodiments, a decode-processing section 1100, an oversampling section 1200, an extended band generating section 1300, a band-variable bandpass filter 1500, a bandpass filter controller 1600, and a band determining section 1700.

This embodiment is distinguished from any of the third to the eleventh embodiments in that a band determination threshold setting section 1900 is included further in the audio processing unit 9500.

The band determination threshold setting section 1900 has a function of setting a level threshold in accordance with an external input, which is used for discriminating the existence of either a subband amplitude or spectrum information with respect to the respective bands in the band determination process at the band determining section 1700. The band determining section 1700 performs a band determination process in accordance with the level threshold of the band determination indicated from the band determination threshold setting section 1900.

The following is a description about an operation of the thus configured audio processing unit. When an audio encoded signal is inputted to the decode-processing section 1100 according to this embodiment, it is decoded by the decode-processing section 1100 so that PCM data are outputted.

The band determining section 1700 analyzes frequency regarding the PCM data from the decode-processing section 1100 on the basis of decoding information from the decode-processing section 1100, generates band determination information with respect to the PCM data from the analytical result, and then sends the band determination information to the bandpass filter controller 1600.

At the band determining section 1700, a level threshold is set in advance for discriminating the existence of either a subband amplitude or spectrum information with respect to the respective bands in the band determination process through the band determination threshold setting section 1900 from the outside.

Therefore, when the level threshold indicated from the outside is set to be lower, a maximum band of the band property regarding the PCM data outputted from the decode-processing section 1100 with respect to the decoding information from the decode-processing section 1100 is set higher. This results in a narrow setting of an extended band in the band extension process with respect to the frequency property of the PCM data decoded by the decode-processing section 1100.

When the level threshold to be indicated from the outside is set to be higher, a maximum band of the band property regarding the PCM data outputted from the decode-processing section 1100 is set lower with respect to the decoding information from the decode-processing section 1100. This results in a wide setting of an extended band in the band extension process with respect to the frequency property of the PCM data decoded by the decode-processing section 1100.

As described above, the band determination threshold setting section 1900 enables adjustment of an effect of a band extension process in accordance with the characteristics of the PCM data to be produced, the user's preferences or the like.

Thirteenth Embodiment

Figure 21:
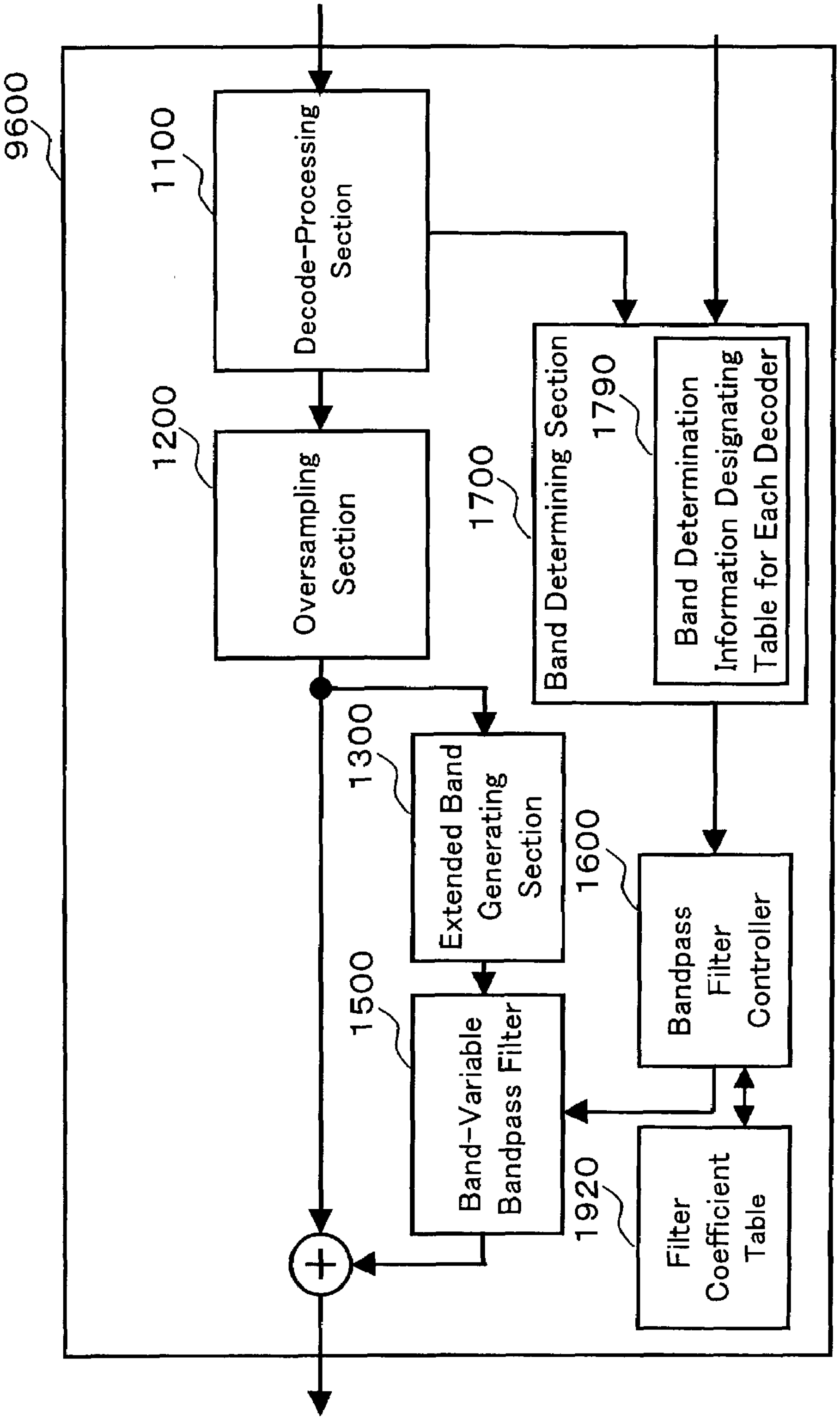
FIG. 21 is a circuit block diagram showing a structural example of an audio processing unit according to a thirteenth embodiment of the present invention.

FIG. 21 is a circuit block diagram showing a structural example of an audio processing unit according to a thirteenth embodiment of the present invention. In FIG. 21, an audio processing unit 9600 includes, as in the case of any of the third to the twelfth embodiments, a decode-processing section 1100, an oversampling section 1200, an extended band generating section 1300, a band-variable bandpass filter 1500, a bandpass filter controller 1600, and a band determining section 1700.

This embodiment is distinguished from any of the third to the twelfth embodiments in that a filter coefficient table 1920 is included further in the audio processing unit 9600, and that the band determining section 1700 includes a band determination information designating table 1790 for each decoder as a band determination switching means for each decoder.

Figure 22:
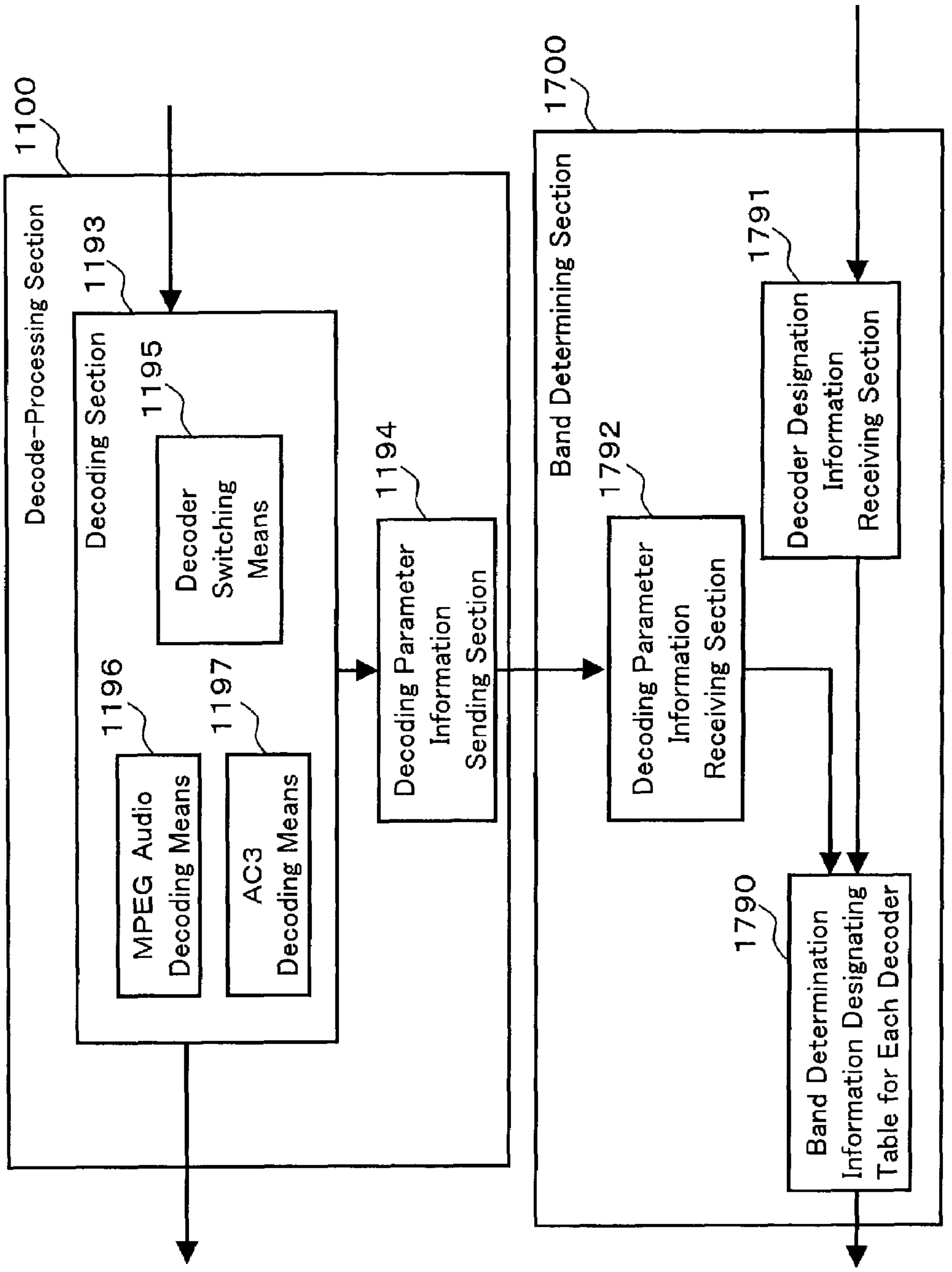
FIG. 22 is a block diagram showing an internal structure of a decode-processing section and a band determining section in the thirteenth embodiment of the present invention.
Figure 25:
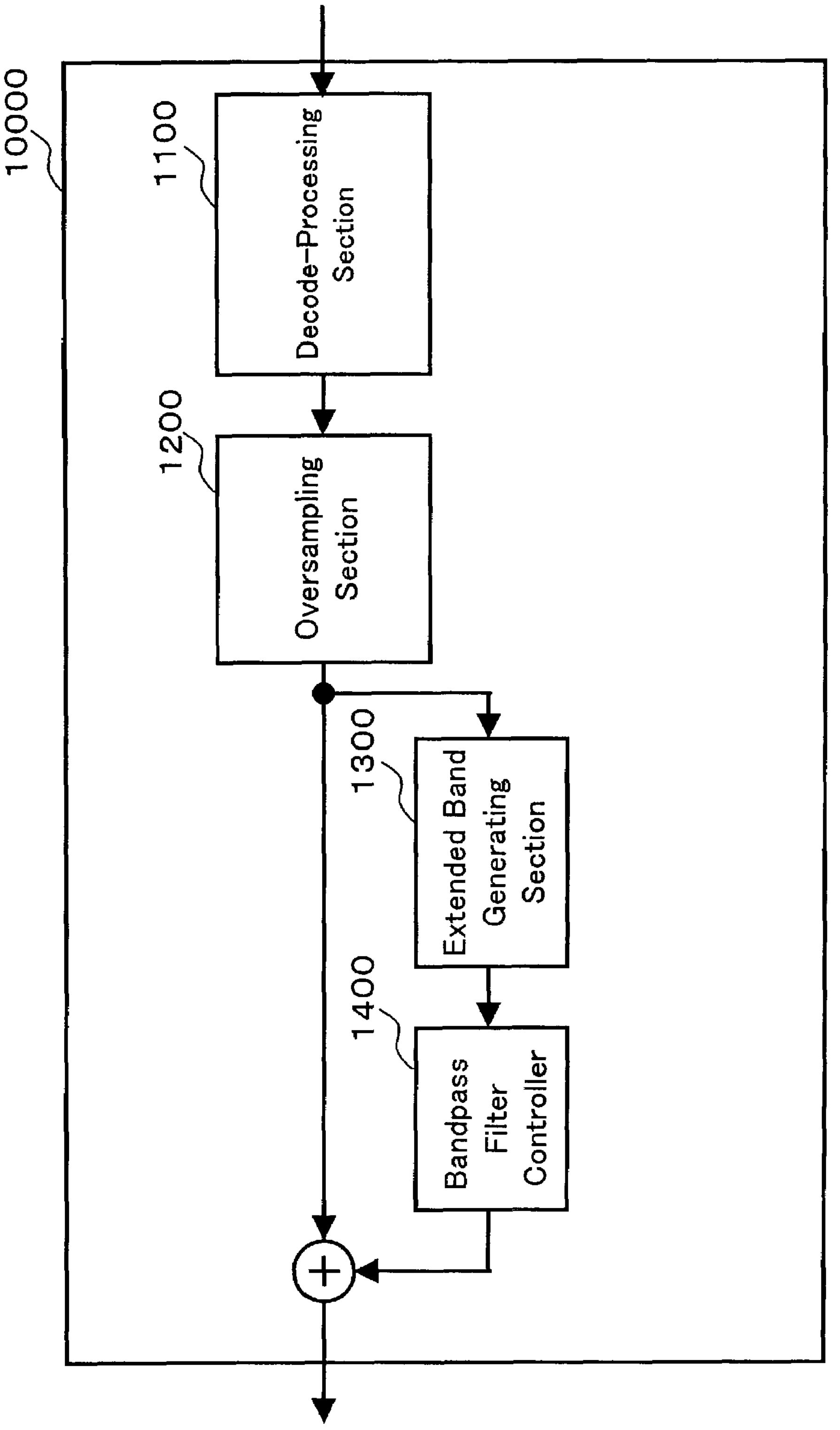
FIG.25 PRIOR ART
FIG. 25 is a circuit block diagram showing a structural example of a conventional audio processing unit.

For facilitating the explanation, the decode-processing section 1100 and the band determining section 1700 in this embodiment have structures as shown in FIG. 22.

In the filter coefficient table 1920, filter tap coefficients as a combination of plural coefficients are stored for a use at the band-variable bandpass filter 1500. By designating the filter type as pointer information, tap coefficients of varied filter properties can be loaded to the band-variable bandpass filter 1500.

In FIG. 22, the decode-processing section 1100 includes a decoding section 1193 and a decoding parameter information sending section 1194. The decoding section 1193 includes a decoder switching means 1195, a MPEG audio decoding means 1196, and an AC3 decoding means 1197.

The decoding section 1193 has a function of decode-processing an audio bit stream inputted from the outside. It performs identification and switching of a decoding means by using the internal decoder switching means 1195. At the same time, the decoding section 1193 sends decoding parameter information to the decoding parameter information sending section 1194.

For facilitating the explanation, the decoding section 1193 according to this embodiment includes a MPEG audio decoding means 1196 and an AC3 decoding means 1197. The MPEG audio decoding means 1196 decodes an audio bit stream encoded by a MPEG audio system. It also has a function of sending sampling frequency information, bit rate index information, and layer information as decoding parameter information to a decoding parameter information sending section 1194 in parallel with the decoding process. The AC3 decoding means 1197 decodes an audio bit stream encoded by a Dolby AC3 system. It also has a function of sending the sampling frequency information and the spectrum information as decoding parameter information to the decoding parameter information sending section 1194 in parallel with the decoding process.

The decoding parameter information sending section 1194 has a function of sending to the outside the decoding parameter information sent from the decoding section 1193.

The band determining section 1700 includes a decoding parameter information receiving section 1792, a decoder designation information receiving section 1791, and a band determination information designating table 1790 for each decoder.

The decoding parameter information receiving section 1792 has a function of receiving the decoding parameter information sent from the decoding parameter information sending section 1194 in the decode-processing section 1100 and sending the information to the band determination information designating table 1790 for each decoder.

The decoder designation information receiving section 1791 has a function of receiving the decoder designation information designated from the outside and sending the information to the band determination information designating table 1790 for each decoder.

The band determination information designating table 1790 for each decoder generates filter coefficient pointer information of the filter coefficient table 1920 based on the decoding parameter information sent from the decoding parameter information receiving section 1792 and the decoder designation information sent from the decoder designation information receiving section 1791.

For facilitating the explanation, FIGS. 23 and 24 show respectively examples of table data structures of the band determination information designating table 1790 for each decoder and the filter coefficient table 1920.

FIG. 23 shows a table structure for the MPEG audio and AC3 of the band determination information designating table 1790 for each decoder. For the MPEG audio, any value of TBL0 to TBL9 are generated as filter coefficient pointer information of the filter coefficient table 1920 from a combination of sampling information, bit rate index information, and layer information. For the AC3, similarly any value of TBL0 to TBL9 are generated as the filter coefficient pointer information of the filter coefficient table 1920 from the spectrum information.

FIG. 23 refers to examples where the designated decoders are a MPEG audio and AC3. It is needless to say that there exist tables for respective decoders to which this system corresponds.

FIG. 24 shows a data structure of the filter coefficient table 1920. This table designates filter tap coefficients to be loaded to the band-variable bandpass filter 1500 on the basis of the filter coefficient pointer information in a range from TBL0 to TBL9 designated by the band determination information designating table 1790 for each decoder.

For the thus configured audio processing unit, this embodiment refers to a case of inputting an audio signal encoded by a MPEG audio standard encoding system of layer 2 in which the sampling frequency is 44.1 kHz and the bit rate index information is 9 so as to decode the encoded signal into an audio signal.

When an audio signal encoded by the MPEG 1 audio standard layer 2 is inputted to the decode-processing section 1100 in this embodiment, the decoding section 1193 limits the decoder to a MPEG audio by using the decoder switching means 1195, performs a decoding process by using the MPEG audio decoding means 1196, and generates PCM data. At the same time, the decoding section 1193 sends sampling frequency information, bit rate index information, and layer information to the decoding parameter information sending section 1194.

A detailed explanation about the PCM data decoded by the decode-processing section 1100 in this embodiment is omitted, since the oversampling process by the oversampling section 1200, and generation of the band extension component by the extended band generating section will be performed as described in any of the second to the seventh embodiments.

The band determining section 1700 receives the decoding parameter information sent from the decoding parameter information sending section 1194 through the decoding parameter information receiving section 1792. At this time, "MPEG audio" is designated as a decoder designation information from the outside at the decoder designation information receiving section 1791.

Next, the band determination information designating table 1790 for each decoder receives the decoder designation information and the decoding parameter information respectively from the decoder designation information receiving section 1791 and the decoding parameter information receiving section 1792. Since the decoder designation information is a MPEG audio and the sampling frequency information is "44.1 kHz", the layer information is "layer 2" and the bit rate index information is "9" as the decoding parameter information, "TBL5" is sent as the filter coefficient pointer information to the bandpass filter controller 1600 as shown in FIG. 23.

Furthermore, since the filter coefficient pointer information is "TBL5" at the bandpass filter controller 1600, the filter coefficient table 1920 shown in FIG. 24 is used for loading the filter tap coefficients Coeff[51]-Coeff[5n] to the band-variable bandpass filter 1500. Subsequent operations are similar to those described in any of the third to the twelfth embodiments.

The following explanation refers to a case of inputting an audio signal having a sampling frequency of 48 kHz encoded by an AC3 standard encoding system in order to decode the encoded signal into an audio signal.

When an audio signal encoded by the AC3 is inputted to the decode-processing section 1100 according to this embodiment, the decoding section 1193 limits the decoder to AC3 by using the decoder switching means 1195, performs a decoding process by using the AC3 decoding means 1196, and generates PCM data. At the same time, the decoding section 1193 sends sampling frequency information and spectrum information to the decoding parameter information sending section 1194. For facilitating the explanation of the embodiment, the spectrum information generated by the AC3 decoding means 1197 is regarded as one of ten indexed levels, and "1" is generated in this case.

For the PCM data decoded by the decode-processing section 1100 according to this embodiment, any of the oversampling processes by the oversampling section 1200 and generation of a band extension component by the extended band generating section 1300 are performed as in the MPEG audio in this embodiment.

The band determining section 1700 receives decoding parameter information sent from the decoding parameter information sending section 1194 through the decoding parameter information receiving section 1792. At this time, "AC3" is designated as decoder designation information from the outside at the decoder designation information receiving section 1791.

Next, the band determination information designating table 1790 for each decoder receives decoder designation information and decoding parameter information respectively from the decoder designation information receiving section 1791 and the decoding parameter information receiving section 1792. Since the decoder designation information is "AC3", the sampling frequency information is "48 kHz", and the spectrum information is "1" as the decoding parameter information, "TBL3" is sent as the filter coefficient pointer information to the bandpass filter controller 1600 as shown in FIG. 23.

Furthermore, since the filter coefficient pointer information is "TBL3" at the bandpass filter controller 1600, the filter coefficient table 1920 shown in FIG. 24 is used for loading the filter tap coefficients Coeff[31]-Coeff[3n] to the band-variable bandpass filter 1500. Subsequent operations are similar to those described in any of the third to the twelfth embodiments.

According to this embodiment where a band determination information designating table 1790 for each decoder is provided, band determination can be conducted corresponding to various decoding processes, and thus more optimum band extension process can be provided automatically.

Furthermore, according to this embodiment where the band determination information designating table 1790 for each decoder and the filter coefficient table 1920 are configured separately, filter tap coefficients can be shared even for a case of a band determination process corresponding to decoding processes differed in the band determination processes. This can lead to reduction in memory resources required for the filter tap coefficients.

The above description refers to a structure including an oversampling section 1200 according to this embodiment. Even when such an oversampling section is not included, similar effects can be obtained except that the extended band is limited further in a comparison with any of the second to the twelfth embodiments by deciding the upper limit frequency FcH to be about 24 kHz in accordance with a Nyquist condition with respect to the decode-processing section 1100 as in the above-described embodiment.

Any of the above-described embodiments refer to PCM audio signals that are band-compressed. The present invention is effective for sound sources having various frequency characteristics even for a linear PCM audio signal.

As mentioned above, the present invention can provide a high sound quality reproduction by extending the band according to the nature of PCM data, even for a case that the band characteristics of an input encoded signal drops at or below a Nyquist frequency (Fs/2) and a case regarding a linear PCM audio signal having various frequency characteristics.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. An audio processing unit for decoding and reproducing an encoded audio signal, the audio processing unit comprising:

a decode-processing section for decoding the encoded audio signal that is inputted from the outside and generating PCM data;

an extended band generating section for generating a band extension component with respect to the PCM data decoded by the decode-processing section;

a band-variable bandpass filter for receiving the band extension component from the extended band generating section, and varying a passband based on the band extension component and outputting;

an adder for adding the PCM data decoded by the decode-processing section and output data from the band-variable bandpass filter;

a band determining section for determining the passband with respect to the band extension component, by using a decoding information of the encoded audio signal obtained from the decode-processing section as band determination information; and a bandpass filter controller for controlling the passband of the band-variable bandpass filter in accordance with an indication from the band determining section.

2. The audio processing unit according to claim 1, wherein the band determining section comprises a spectrum analyzer for analyzing a spectrum of the PCM data generated by the decode-processing section and determines a passband with respect to the band extension component by using the analytical result from the spectrum analyzer as the band determination information.

3. The audio processing unit according to claim 1, wherein the decode-processing section comprises: an auxiliary information analyzing section for analyzing auxiliary information of the encoded audio signal, a spectrum data generating section for generating spectrum data on the basis of the auxiliary information, a PCM data generating section for transforming the spectrum data and generating PCM data, and a spectrum information sending section for externally sending spectrum information of the spectrum data generated at the spectrum data generating section; and the band determining section comprises a spectrum information receiving section for receiving the spectrum information sent from the spectrum information sending section and determines a passband with respect to the band extension component by using the spectrum information as the band determination information.

4. The audio processing unit according to claim 1, wherein the decode-processing section comprises: an auxiliary information analyzing section for analyzing auxiliary information of the encoded audio signal, a subband data generating section for generating subband data on the basis of the auxiliary information, a PCM data generating section for band-composing the subband data and generating PCM data, and a subband amplitude information sending section for externally sending amplitude information of subband data generated by the subband data generating section; and the band determining section comprises a subband amplitude information receiving section for receiving the subband amplitude information sent from the subband amplitude information sending section and determines a passband with respect to the band extension component by using the subband amplitude information as the band determination information.

5. The audio processing unit according to claim 1, wherein the decode-processing section comprises: an auxiliary information analyzing section for analyzing auxiliary information of the encoded audio signal, a decode-core section for conducting a decoding process and generating PCM data, and a scale factor information sending section for externally sending scale factor information extracted by the auxiliary information analyzing section; and the band determining section comprises a scale factor information receiving section for receiving the scale factor information sent from the scale factor information sending section and determines a passband with respect to the band extension component by using the scale factor information as the band determination information.

6. The audio processing unit according to claim 1, wherein the decode-processing section comprises: an auxiliary information analyzing section for analyzing auxiliary information of the encoded audio signal, a decode-core section for conducting a decoding process and generating PCM data on the basis of the auxiliary information, and a bit rate information sending section for externally sending bit rate information extracted by the auxiliary information analyzing section; and the band determining section comprises a bit rate information receiving section for receiving the bit rate information sent from the bit rate information sending section and determines a passband with respect to the band extension component by using the bit rate information as the band determination information.

7. The audio processing unit according to claim 6, wherein the decode-processing section comprises a sampling frequency information sending section for externally sending sampling frequency information extracted by the internal auxiliary information analyzing section; and the band determining section comprises a sampling frequency information receiving section for receiving the sampling frequency information sent from the sampling frequency information sending section and a band determination information generating section for generating the band determination information from a combination of the sampling frequency information and the bit rate information, and determines a passband with respect to the band extension component by using the band determination information generated by the band determination information generating section.

8. The audio processing unit according to claim 7, wherein the decode-processing section comprises a layer information sending section for externally sending layer information extracted by the internal auxiliary information analyzing section; and the band determining section comprises a layer information receiving section for receiving the layer information sent from the layer information sending section and a band determination information generating section for generating the band determination information from a combination of the layer information, the sampling frequency information and the bit rate information, and determines a passband with respect to the band extension component by using the band determination information generated by the band determination information generating section.

9. The audio processing unit according to claim 1, wherein the band determining section comprises a band determination smoothing section for automatically smoothing a change of the band determination information sent from the decode-processing section and determines a passband with respect to the band extension component by using band determination information smoothed by the band determination smoothing section.

10. The audio processing unit according to claim 1, wherein the audio processing unit comprises a band determination interval setting section for setting in accordance with an external signal a time interval for a band determination process at the band determining section.

11. The audio processing unit according to claim 1, wherein the audio processing unit comprises a band determination threshold setting section for setting in accordance with an external signal a level threshold for discriminating a subband amplitude or presence of spectrum information in the band determination process at the band determining section with respect to each band.

12. The audio processing unit according to claim 1, wherein the decode-processing section corresponds to a decoding process of at least two kinds of decoding systems, and switches the decoding process on the basis of decoder information designated by the outside; and the band determining section comprises a band determination switching means for each decoder, which switches the band determination process in accordance with decoder information designated by the outside.

13. The audio processing unit according to claim 12, wherein the audio processing unit comprises a filter coefficient table storing a filter coefficient for use in the band-variable bandpass filter; and the band determination switching means for each decoder is a band determination information designating table for each decoder, which is used far designating each band to each decoder, the band determining section conducts a band determination on the basis of the band determination information designating table for each decoder in accordance with decoder information that is designated by the outside and sends band determination information as pointer information of the filter coefficient table to the bandpass filter controller.

14. An audio processing unit for decoding and reproducing an encoded audio signal, the audio processing unit comprising:

a decode-processing section for decoding the encoded audio signal that is inputted from the outside and generating PCM data;

an oversampling section for conducting an oversampling process with respect to the PCM data decoded by the decode-processing section;

an extended band generating section for generating a band extension component with respect to the PCM data oversampled by the oversampling section;

a band-variable bandpass filter for receiving a band extension component from the extended band generating section, and varying the passband based on the band extension component and outputting;

an adder for adding output data from the oversampling section and output data from the band-variable bandpass filter a band determining section for determining the passband with respect to the band extension component, by using a decoding information of the encoded audio signal obtained from the decode-processing section as band determination information; and a bandpass filter controller for controlling the passband of the band-variable bandpass filter in accordance with an indication from the band determining section.

15. The audio processing unit according to claim 14, wherein the band determining section comprises a spectrum analyzer for analyzing a spectrum of the PCM data generated by the decode-processing section and determines a passband with respect to the band extension component by using the analytical result from the spectrum analyzer as the band determination information.

16. The audio processing unit according to claim 14, wherein the decode-processing section comprises: an auxiliary information analyzing section for analyzing auxiliary information of the encoded audio signal, a spectrum data generating section for generating spectrum data on the basis of the auxiliary information, a PCM data generating section for transforming the spectrum data and generating PCM data, and a spectrum information sending section for externally sending spectrum information of the spectrum data generated at the spectrum data generating section; and the band determining section comprises a spectrum information receiving section for receiving the spectrum information sent from the spectrum information sending section and determines a passband with respect to the band extension component by using the spectrum information as the band determination information.

17. The audio processing unit according to claim 14, wherein the decode-processing section comprises: an auxiliary information analyzing section for analyzing auxiliary information of the encoded audio signal, a subband data generating section for generating subband data on the basis of the auxiliary information, a PCM data generating section for band-composing the subband data and generating PCM data, and a subband amplitude information sending section for externally sending amplitude information of subband data generated by the subband data generating section; and the band determining section comprises a subband amplitude information receiving section for receiving the subband amplitude information sent from the subband amplitude information sending section and determines a passband with respect to the band extension component by using the subband amplitude information as the band determination information.

18. The audio processing unit according to claim 14, wherein the decode-processing section comprises: an auxiliary information analyzing section for analyzing auxiliary information of the encoded audio signal, a decode-core section for conducting a decoding process and generating PCM data, and a scale factor information sending section for externally sending scale factor information extracted by the auxiliary information analyzing section; and the band determining section comprises a scale factor information receiving section for receiving the scale factor information sent from the scale factor information sending section and determines a passband with respect to the band extension component by using the scale factor information as the band determination information.

19. The audio processing unit according to claim 14, wherein the decode-processing section comprises: an auxiliary information analyzing section for analyzing auxiliary information of the encoded audio signal, a decode-core section for conducting a decoding process and generating PCM data on the basis of the auxiliary information, and a bit rate information sending section for externally sending bit rate information extracted by the auxiliary information analyzing section; and the band determining section comprises a bit rate information receiving section for receiving the bit rate information sent from the bit rate information sending section and determines a passband with respect to the band extension component by using the bit rate information as the band determination information.

20. The audio processing unit according to claim 19, wherein the decode-processing section comprises a sampling frequency information sending section for externally sending sampling frequency information extracted by the internal auxiliary information analyzing section; and the band determining section comprises a sampling frequency information receiving section for receiving the sampling frequency information sent from the sampling frequency information sending section and a band determination information generating section for generating the band determination information from a combination of the sampling frequency information and the bit rate information, and determines a passband with respect to the band extension component by using the band determination information generated by the band determination information generating section.

21. The audio processing unit according to claim 20, wherein the decode-processing section comprises a layer information sending section for externally sending layer Information extracted by the internal auxiliary information analyzing section; and the band determining section comprises a layer information receiving section for receiving the layer information sent from the layer information sending section and a band determination information generating section for generating the band determination information from a combination of the layer information, the sampling frequency information and the bit rate information, and determines a passband with respect to the band extension component by using the band determination information generated by the band determination information generating section.

22. The audio processing unit according to claim 14, wherein the band determining section comprises a band determination smoothing section for automatically smoothing a change of the band determination information sent from the decode-processing section and determines a passband with respect to the band extension component by using band determination information smoothed by the band determination smoothing section.

23. The audio processing unit according to claim 14, wherein the audio processing unit comprises a band determination interval setting section for setting in accordance with an external signal a time interval for a band determination process at the band determining section.

24. The audio processing unit according to claim 14, wherein the audio processing unit comprises a band determination threshold setting section for setting in accordance with an external signal a level threshold for discriminating a subband amplitude or presence of spectrum information in the band determination process at the band determining section with respect to each band.

25. The audio processing unit according to claim 14, wherein the decode-processing section corresponds to a decoding process of at least two kinds of decoding systems, and switches the decoding process on the basis of decoder information designated by the outside; and the band determining section comprises a band determination switching means for each decoder, which switches the band determination process in accordance with decoder information designated by the outside.

26. The audio processing unit according to claim 25, wherein the audio processing unit comprises a filter coefficient table storing a filter coefficient for use in the band-variable bandpass filter; and the band determination switching means for each decoder is a band determination information designating table for each decoder, which is used for designating each band to each decoder; the band determining section conducts a band determination on the basis of the band determination information designating table for each decoder in accordance with decoder information that is designated by The outside and sends band determination information as pointer information of the filter coefficient table to the bandpass filter controller.

* * * * *